United States Patent
Hsu et al.

(10) Patent No.: US 11,966,621 B2
(45) Date of Patent: Apr. 23, 2024

(54) NON-VOLATILE STORAGE SYSTEM WITH PROGRAM EXECUTION DECOUPLED FROM DATALOAD

(71) Applicant: SanDisk Technologies LLC, Addison, TX (US)

(72) Inventors: Hua-Ling Cynthia Hsu, Fremont, CA (US); Aaron Lee, Sunnyvale, CA (US)

(73) Assignee: SanDisk Technologies LLC, Addison, TX (US)

( * ) Notice: Subject to any disclaimer, the term of this patent is extended or adjusted under 35 U.S.C. 154(b) by 70 days.

(21) Appl. No.: 17/674,543

(22) Filed: Feb. 17, 2022

(65) Prior Publication Data
US 2023/0259300 A1 Aug. 17, 2023

(51) Int. Cl.
*G06F 3/06* (2006.01)
*G06F 12/02* (2006.01)

(52) U.S. Cl.
CPC .......... *G06F 3/0655* (2013.01); *G06F 3/0604* (2013.01); *G06F 3/0656* (2013.01); *G06F 3/0679* (2013.01); *G06F 12/0246* (2013.01); *G06F 2212/7203* (2013.01)

(58) Field of Classification Search
None
See application file for complete search history.

(56) References Cited

U.S. PATENT DOCUMENTS

| | | | |
|---|---|---|---|
| 6,370,651 B1 * | 4/2002 | Durante | G11C 16/32 713/601 |
| 8,386,699 B2 | 2/2013 | Yeh | |
| 8,848,478 B2 | 9/2014 | Datla et al. | |
| 9,117,530 B2 | 8/2015 | Pandya et al. | |
| 9,727,267 B1 | 8/2017 | Sebastian et al. | |
| 9,760,311 B1 | 9/2017 | Amir et al. | |
| 11,029,859 B2 | 6/2021 | Margetts et al. | |

(Continued)

OTHER PUBLICATIONS

Shiratake et al. "A Pseudo Multi-Bank DRAM with Categorized Access Sequence." 1999. IEEE. 1999 Symposium on VLSI Circuits. pp. 127-130.*

(Continued)

*Primary Examiner* — Nathan Sadler
(74) *Attorney, Agent, or Firm* — Vierra Magen Marcus LLP

(57) ABSTRACT

Technology is disclosed for a non-volatile memory system that decouples dataload from program execution. A memory controller transfers data for a program operation and issues a first type of program execution command. When in a coupled mode, the die programs the data in response to the first type of program execution command. When in a decoupled mode, rather than program the data into non-volatile memory cells the die enters a wait state. Optionally, the memory controller can instruct another die to execute a memory operation while the first die is in the wait state. In response to receiving a second type of program execution command from the memory controller when in the wait state, the first die will program the data into non-volatile memory cells. The memory controller may issue the second type of program execution command in response to determining that sufficient power resources (or thermal budget) exist.

17 Claims, 15 Drawing Sheets

(56) References Cited

U.S. PATENT DOCUMENTS

| | | | |
|---|---|---|---|
| 2006/0136656 A1* | 6/2006 | Conley | G06F 12/0246 |
| | | | 711/E12.04 |
| 2006/0179213 A1* | 8/2006 | Brittain | G06F 13/161 |
| | | | 711/105 |
| 2014/0022842 A1 | 1/2014 | Jung et al. | |
| 2016/0378672 A1* | 12/2016 | Dulloor | G06F 3/061 |
| | | | 711/135 |
| 2018/0314635 A1* | 11/2018 | Alam | G11C 29/52 |
| 2019/0214087 A1 | 7/2019 | Weinberg et al. | |
| 2019/0286369 A1* | 9/2019 | Liu | G06F 3/0679 |

OTHER PUBLICATIONS

Onfi Group, "Open NAND Flash Interface Specification," Rev. 5.0, May 25, 2021, 383 pages.

* cited by examiner

NON-VOLATILE STORAGE SYSTEM WITH PROGRAM EXECUTION DECOUPLED FROM DATALOAD

BACKGROUND

Semiconductor memory is widely used in various electronic devices such as cellular telephones, digital cameras, medical electronics, mobile computing devices, servers, solid state drives, non-mobile computing devices and other devices. Semiconductor memory may comprise non-volatile memory or volatile memory. Non-volatile memory allows information to be stored and retained even when the non-volatile memory is not connected to a source of power (e.g., a battery). An apparatus that includes a memory system, or is connected to a memory system, is often referred to as a host.

Memory systems that interface with a host are required to limit power consumption and thermal dissipation to meet both host and memory system constraints. The power and thermal limits are required to ensure that the power supply regulators provided by the host are not overloaded by excess current, the power supply regulators included with the memory system are not overloaded by excess current, batteries associated with the host are drained at a rate that is acceptable to the end customer, and the temperature of the system (including the host, memory and all associated components) are maintained within valid operating ranges.

BRIEF DESCRIPTION OF THE DRAWINGS

Like-numbered elements refer to common components in the different figures.

DETAILED DESCRIPTION

Figure 1A:
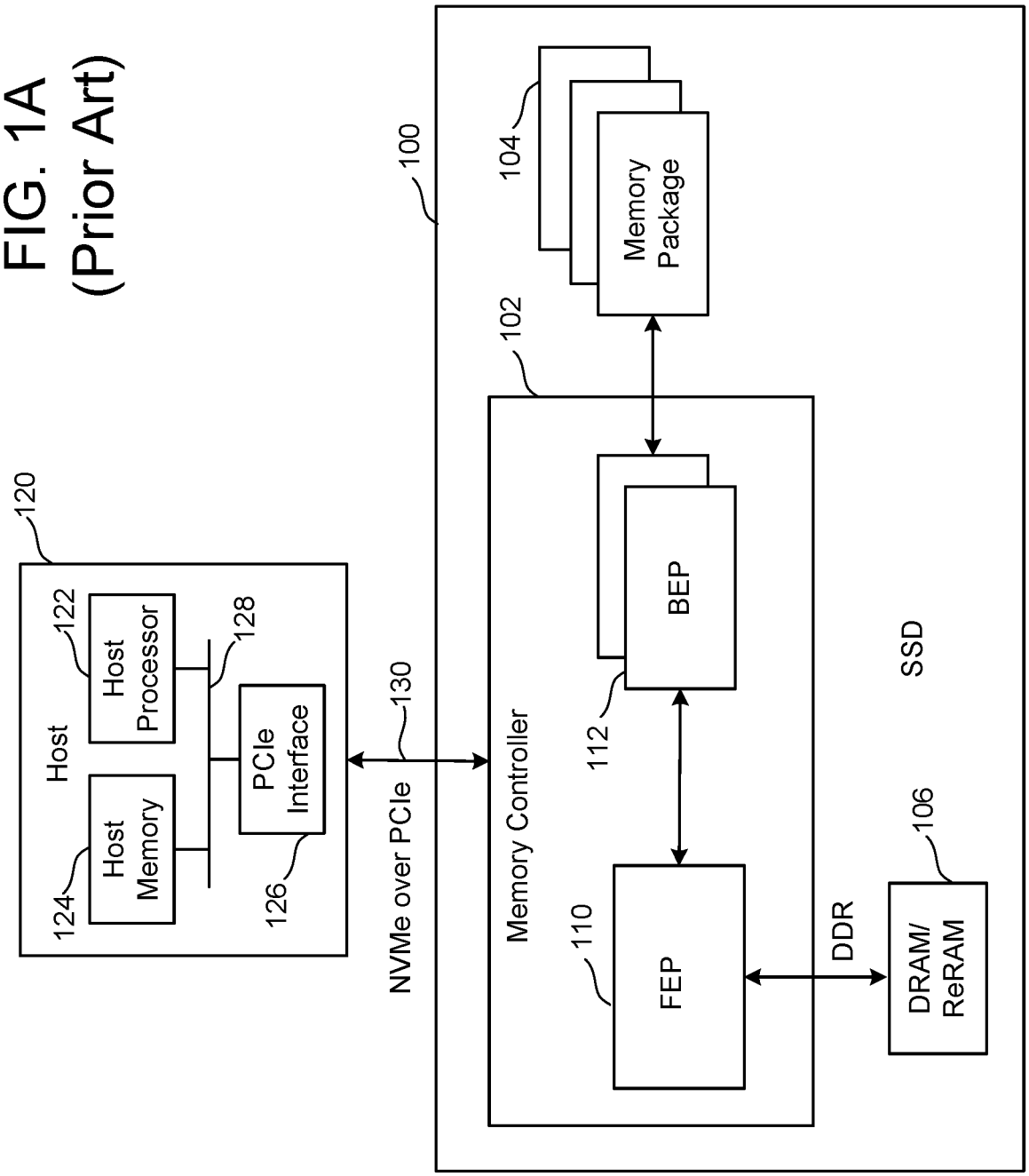
FIG. 1A is a block diagram of one embodiment of a storage system connected to a host.

When data is written to a semiconductor die, it is often done so using multiple stages combined together into a single atomic sequence. In each stage of the write operation, power is consumed in a manner that impact different limits relative to other stages of the write operation. In the first stage (also known as data transfer or dataload), the memory controller transfers data to latches on the semiconductor die by toggling bus signals, consuming power from the regulator responsible for supplying the memory I/O voltage supply. In the second stage (the actual write execution or program execution), the semiconductor die consumes power from its core supply by programming data from its latches into non-volatile memory cells. During both stages of the write operation, power is consumed from the host provided supply and heat is dissipated. Each scheduled write must ensure that the power consumption of semiconductor die I/O supply does not exceed its defined limits during the dataload stage, that the power consumption of the semiconductor die core supply does not exceed its defined limits during the programming stage, and that the host power consumption limit and thermal dissipation limits are not exceeded throughout both steps.

High performance memory systems include one or more memory controllers that connect to multiple semiconductor dies that are each capable of performing an independent set of memory operations (e.g., write, read, erase). For example, one semiconductor die may be performing a write operation while other semiconductor dies are busy performing erase or read operations. The memory controller is responsible for maximizing the system performance by ensuring that memory operations are scheduled as efficiently as possible by maximizing the workload of available semiconductor dies while meeting the host and device specified power consumption and heat dissipation limits.

A non-volatile memory system is proposed that implements the writing of data by decoupling the dataload and the program execution. In some embodiments, the memory system has an operating mode in which program execution is decoupled from dataload (referred to herein as a "decoupled mode") and an operating mode in which program execution is coupled to dataload (referred to herein as a "coupled mode"). The memory controller may select the operating mode based on power and/or temperature considerations. For example, when the memory system is at normal temperature, the memory controller may operate the system in a coupled mode that allows full power usage to achieve high performance. However, if the temperature increases beyond a temperature, then threshold thermal throttling may be triggered. During thermal throttling, the memory controller may operate the system in a decoupled mode. Operating in the decoupled mode keeps the memory system temperature from getting too high. Operating in the decoupled mode keeps memory system power usage within limits.

In some embodiments, the decoupling of the dataload and the program execution provides for more efficient use of memory system resources and higher performance. For example, one embodiment includes the memory controller transferring the data for a program operation to a first die when the first die is in a decoupled mode. Then, the memory controller issues a first type of program execution command. However, rather than program the data into non-volatile memory cells, the first die enters a wait state when in the decoupled mode. Optionally, the memory controller can instruct another die to execute a memory operation while the first die is in the wait state, thereby maintaining system performance while staying within power and temperature limits. When the memory controller determines that the first die should program the memory cells, the memory controller issues a second type of program execution command to the first die. In response to this second type of program execution command, the first die will program the data into non-volatile memory cells. The memory controller may issue the second type of program execution command in response to determining that sufficient power resources (or thermal budget) exist to program the memory cells. Therefore, the memory system stays within power and temperature limits.

In an embodiment, when the semiconductor die is in a coupled mode the die does not enter the wait state in response to receiving the first type of program execution command after loading data for a program operation. Instead, the semiconductor die immediately programs the data into non-volatile memory cells response to receiving the first type of program execution command when in the coupled mode.

FIG. 1A-FIG. 4B describe one example of a non-volatile storage system that can be used to implement the technology disclosed herein.

FIG. 1A is a block diagram of one embodiment of a non-volatile storage system 100 connected to a host system 120. Storage system 100 can implement the technology disclosed herein. Many different types of storage systems can be used with the technology disclosed herein. One example storage system is a solid-state drive ("SSD"); however, other types of storage systems can also be used. Storage system 100 comprises a memory controller 102, memory package 104 for storing data, and local memory (e.g. DRAM/ReRAM) 106. Memory controller 102 comprises a Front-End Processor Circuit (FEP) 110 and one or more Back-End Processor Circuits (BEP) 112. In one embodiment FEP 110 circuit is implemented on an ASIC. In one embodiment, each BEP circuit 112 is implemented on a separate ASIC. The ASICs for each of the BEP circuits 112 and the FEP circuit 110 are implemented on the same semiconductor die such that the memory controller 102 is manufactured as a System on a Chip ("SoC"). FEP 110 and BEP 112 both include their own processors. In one embodiment, FEP 110 and BEP 112 work as a master slave configuration where the FEP 110 is the master and each BEP 112 is a slave. For example, FEP circuit 110 implements a flash translation layer that performs memory management (e.g., garbage collection, wear leveling, etc.), logical to physical address translation, communication with the host, management of DRAM (local volatile memory) and management of the overall operation of the SSD (or other non-volatile storage system). The BEP circuit 112 manages memory operations in the memory package 104 at the request of FEP circuit 110. For example, the BEP circuit 112 can carry out the read, erase, and programming processes. Additionally, the BEP circuit 112 can perform buffer management, set specific voltage levels required by the FEP circuit 110, perform error correction (ECC), control the Toggle Mode interfaces to the memory packages, etc. In one embodiment, each BEP circuit 112 is responsible for its own set of memory packages. Memory controller 102 is one example of a control circuit.

In one embodiment, there are a plurality of memory packages 104. Each memory package 104 may contain one or more dies that contain non-volatile memory cells (i.e., "memory dies"). A memory package 104 may also contain one or more control dies. A control die is a semiconductor die that contains one or more control circuits for operating (e.g., reading, erasing, writing) memory cells on a memory die. Herein the term, semiconductor die (or more succinctly "die") may be used to refer to either a memory die or a control die. In one embodiment, each memory die in the memory package 104 utilizes NAND flash memory (including two-dimensional NAND flash memory and/or three-dimensional NAND flash memory). In other embodiments, the memory package 104 can include other types of memory; for example, the memory package can include Phase Change Memory (PCM) memory.

In one embodiment, memory controller 102 communicates with host system 120 using an interface 130 that implements NVM Express (NVMe) over PCI Express (PCIe). For working with storage system 100, host system 120 includes a host processor 122, host memory 124, and a PCIe interface 126, which communicate over bus 128. Host memory 124 is the host's physical memory, and can be DRAM, SRAM, non-volatile memory, or another type of storage. Host system 120 is external to and separate from storage system 100. In one embodiment, storage system 100 is embedded in host system 120. In other embodiments, the controller 102 may communicate with host 120 via other types of communication buses and/or links, including for example, over an NVMe over Fabrics architecture, or a cache/memory coherence architecture based on Cache Coherent Interconnect for Accelerators (CCIX), Compute Express Link (CXL), Open Coherent Accelerator Processor Interface (OpenCAPI), Gen-Z and the like. For simplicity, the example embodiments below will be described with respect to a PCIe example.

Figure 1B:
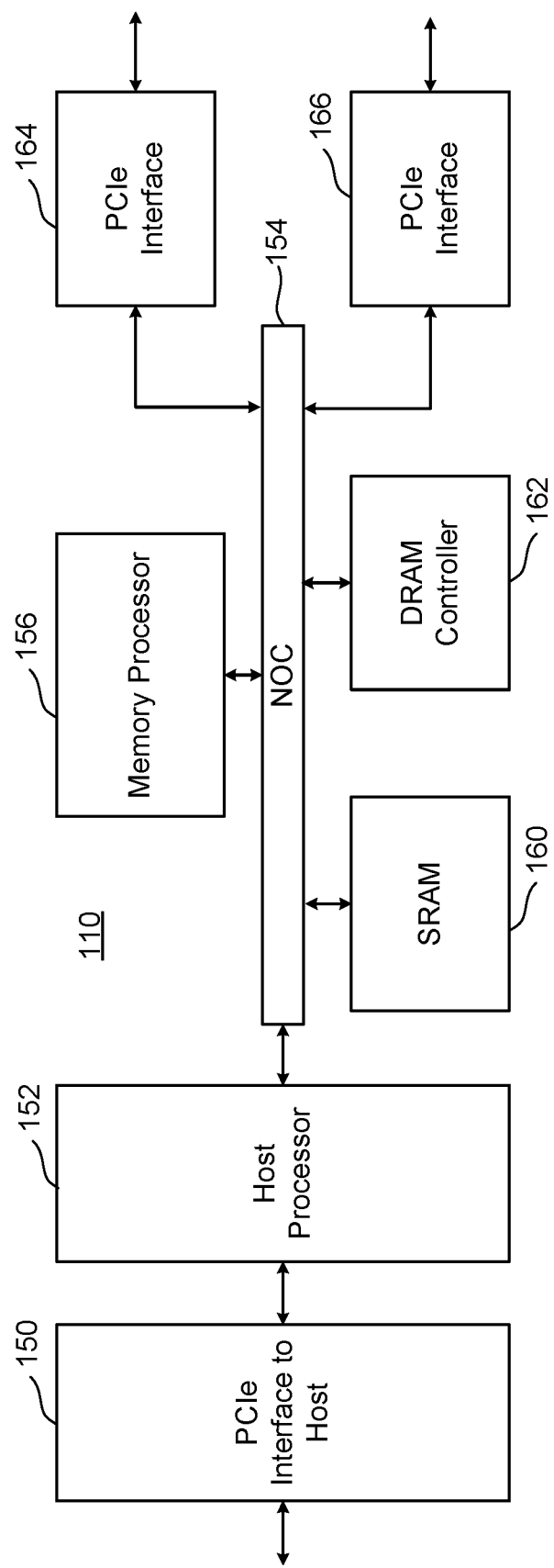
FIG. 1B is a block diagram of one embodiment of a Front-End Processor Circuit.

FIG. 1B is a block diagram of one embodiment of FEP circuit 110. FIG. 1B shows a PCIe interface 150 to communicate with host system 120 and a host processor 152 in communication with that PCIe interface. The host processor 152 can be any type of processor known in the art that is suitable for the implementation. Host processor 152 is in communication with a network-on-chip (NOC) 154. A NOC is a communication subsystem on an integrated circuit, typically between cores in a SoC. NOC's can span synchronous and asynchronous clock domains or use un-clocked asynchronous logic. NOC technology applies networking theory and methods to on-chip communications and brings notable improvements over conventional bus and crossbar interconnections. NOC improves the scalability of SoCs and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). Connected to and in communication with NOC 154 is the memory processor 156, SRAM 160 and a DRAM controller 162. The DRAM controller 162 is used to operate and communicate with the DRAM (e.g., DRAM 106). SRAM 160 is local RAM memory used by memory processor 156. Memory processor 156 is used to run the FEP circuit and perform the various memory operations. Also in communication with the NOC are two PCIe Interfaces 164 and 166. In the embodiment of FIG. 1B, memory controller 102 includes two BEP circuits 112; therefore, there are two PCIe Interfaces 164/166. Each PCIe Interface communicates with one of the BEP circuits 112. In other embodiments, there can be more or fewer than two BEP circuits 112; therefore, there can be more than two PCIe Interfaces.

Figure 2A:
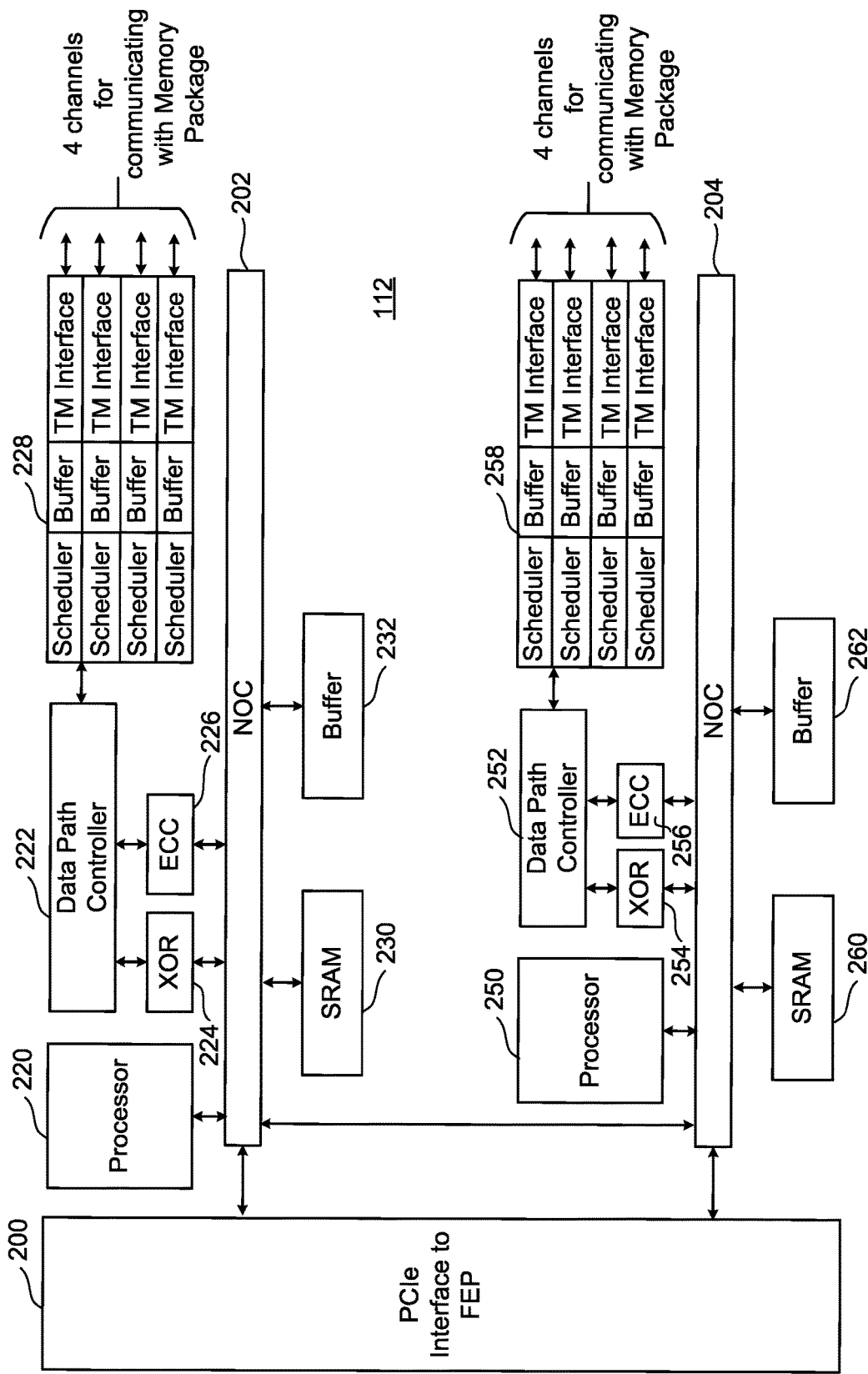
FIG. 2A is a block diagram of one embodiment of a Back-End Processor Circuit.

FIG. 2A is a block diagram of one embodiment of the BEP circuit 112. FIG. 2A shows a PCIe Interface 200 for communicating with the FEP circuit 110 (e.g., communicating with one of PCIe Interfaces 164 and 166 of FIG. 1B). PCIe Interface 200 is in communication with two NOCs 202 and 204. In one embodiment the two NOCs can be combined to one large NOC. Each NOC (202/204) is connected to SRAM (230/260), a buffer (232/262), processor (220/250), and a data path controller (222/252) via an XOR engine (224/254), an ECC engine (226/256).

The ECC engines 226/256 are used to perform error correction, as known in the art. Herein, the ECC engines 226/256 may be referred to as controller ECC engines. The XOR engines 224/254 are used to XOR the data so that data can be combined and stored in a manner that can be recovered in case there is a programming error. In an embodiment, the XOR engines 224/254 can recover data that cannot be decoded using ECC engine 226/256.

Data path controller 222 is connected to a memory interface 228 for communicating via four channels with integrated memory assemblies. Thus, the top NOC 202 is associated with memory interface 228 for four channels for communicating with integrated memory assemblies and the bottom NOC 204 is associated with memory interface 258 for four additional channels for communicating with integrated memory assemblies. In one embodiment, each memory interface 228/258 includes four Toggle Mode interfaces (TM Interface), four buffers and four schedulers. There is one scheduler, buffer, and TM Interface for each of the channels. The processor can be any standard processor known in the art. The data path controllers 222/252 can be a processor, FPGA, microprocessor, or other type of controller. The XOR engines 224/254 and ECC engines 226/256 are dedicated hardware circuits, known as hardware accelerators. In other embodiments, the XOR engines 224/254, ECC engines 226/256 can be implemented in software. The scheduler, buffer, and TM Interfaces are hardware circuits. In other embodiments, the memory interface (an electrical circuit for communicating with memory dies) can be a different structure than depicted in FIG. 2A. Additionally, controllers with structures different than FIGS. 1B and 2A can also be used with the technology described herein.

The table below provides a definition of one example of Toggle Mode Interface.

TABLE 1

| Signal Name | Type | Function |
| --- | --- | --- |
| ALE | Input | Address Latch Enable controls the activating path for addresses to the internal address registers. Addresses are latched on the rising edge of WEn with ALE high. |
| CEn | | Chip Enable controls memory die selection. |
| CLE | Input | Command Latch Enable controls the activating path for commands sent to the command register. When active high, commands are latched into the command register through the I/O ports on the rising edge of the WEn signal. |
| RE | Input | Read Enable Complement |
| REn | Input | Read Enable controls serial data out, and when active, drives the data onto the I/O bus. |
| WEn | Input | Write Enable controls writes to the I/O port. Commands and addresses are latched on the rising edge of the WEn pulse. |
| WPn | Input | Write Protect provides inadvertent program/erase protection during power transitions. The internal high voltage generator is reset when the WPn pin is active low. |
| DQS | Input/Output | Data Strobe acts as an output when reading data, and as an input when writing data. DQS is edge-aligned with data read; it is center-aligned with data written. |
| DQSn | Input/Output | Data Strobe complement (used for DDR) |
| Bus [0:7] | Input/Output | Data Input/Output (I/O) bus inputs commands, addresses, and data, and outputs data during Read operations. The I/O pins float to High-z when the chip is deselected or when outputs are disabled. |
| R/Bn | Output | Ready/Busy indicates device operation status. R/Bn is an open-drain output and does not float to High-z when the chip is deselected or when outputs are disabled. When low, it indicates that a program, erase, or random read operation is in process; it goes high upon completion. |

Figure 2B:
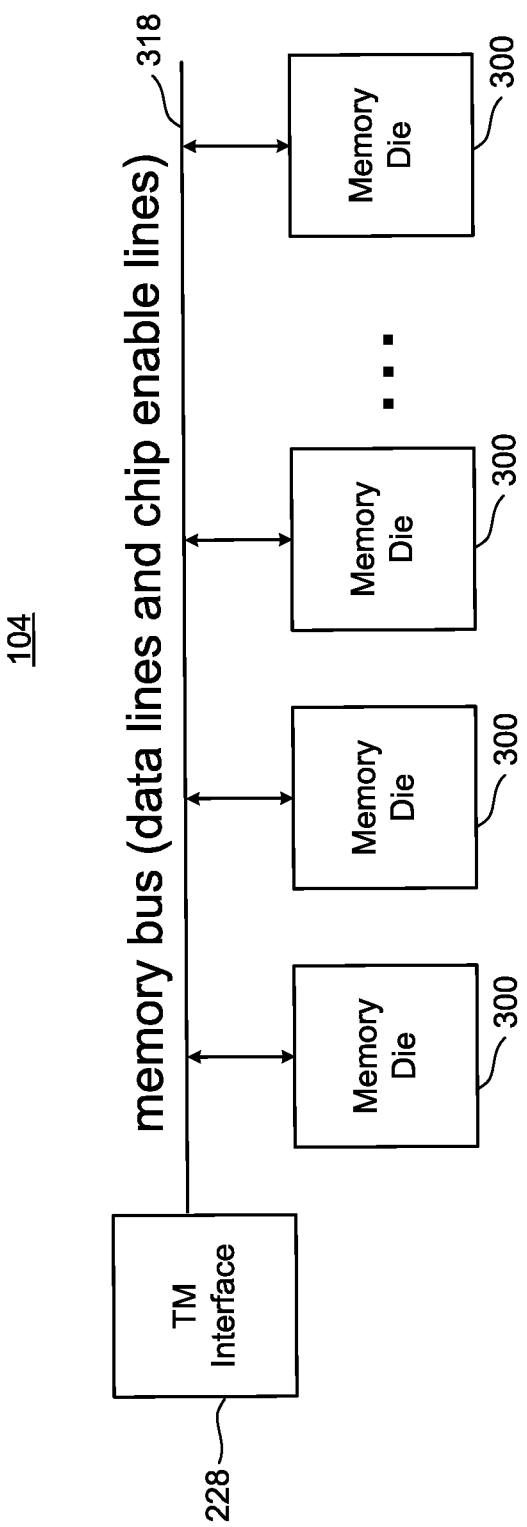
FIG. 2B is a block diagram of one embodiment of a memory package.

FIG. 2B is a block diagram of one embodiment of a memory package 104 that includes a plurality of memory dies 300 connected to a memory bus (data lines and chip enable lines) 318. The memory bus 318 connects to a Toggle Mode Interface 228 for communicating with the TM Interface of a BEP circuit 112 (see e.g., FIG. 2A). In some embodiments, the memory package can include a small controller connected to the memory bus and the TM Interface. In total, the memory package 104 may have eight or 16 memory die; however, other numbers of memory dies can also be implemented. The technology described herein is not limited to any particular number of memory dies. In some embodiments, the memory package can also include a processor, CPU device, such as a RISC-V CPU along with some amount of RAM to help implement some of capabilities described below. The technology described herein is not limited to any particular number of memory die.

Figure 3A:
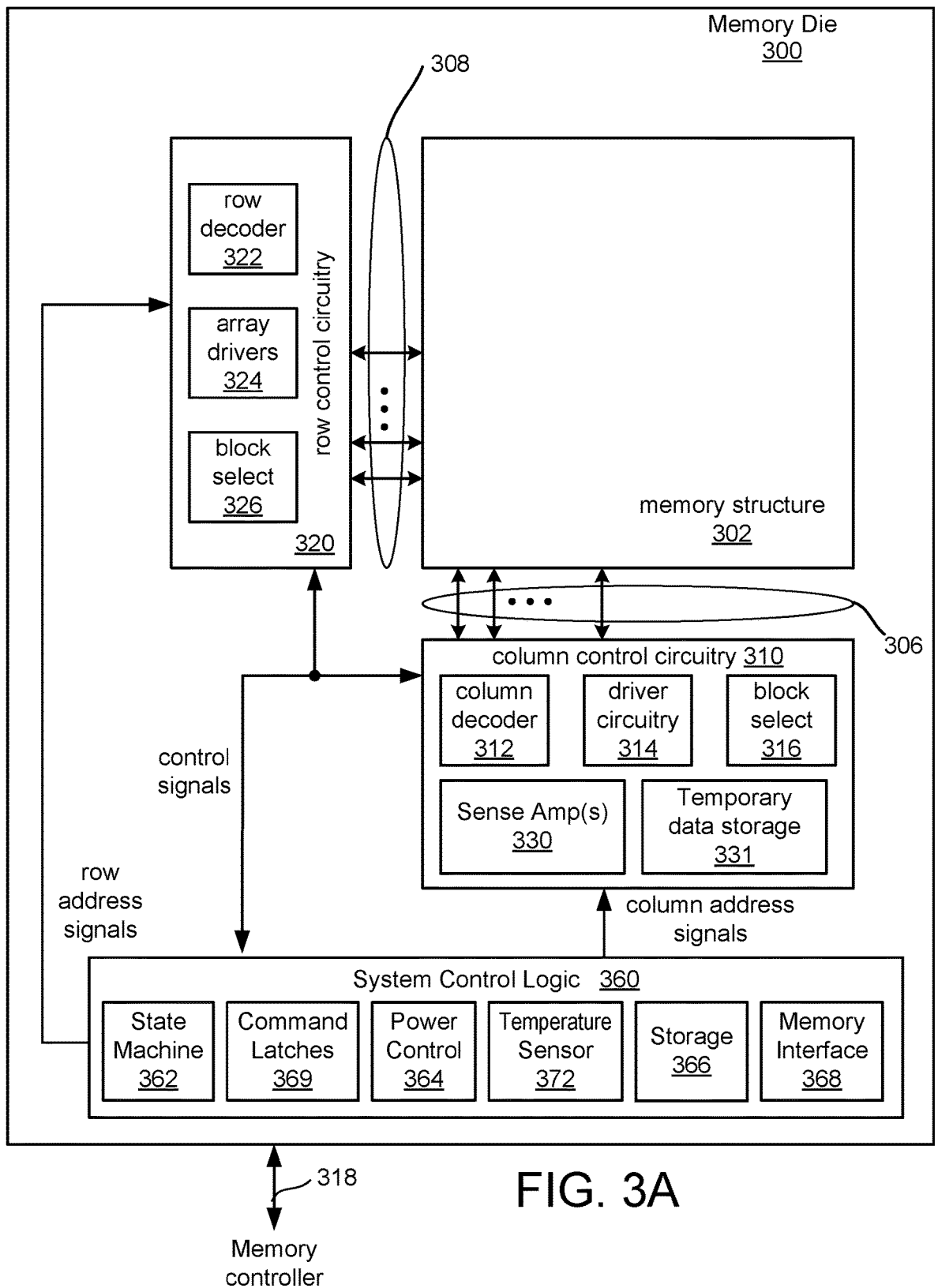
FIG. 3A is a functional block diagram of an embodiment of a memory die.

FIG. 3A is a block diagram that depicts one example of a memory die 300 that can implement the technology described herein. Memory die 300, which can correspond to one of the memory die 300 of FIG. 2B, includes a memory array 302 that can include any of memory cells described in the following. The array terminal lines of memory array 302 include the various layer(s) of word lines organized as rows, and the various layer(s) of bit lines organized as columns. However, other orientations can also be implemented. Memory die 300 includes row control circuitry 320, whose outputs 308 are connected to respective word lines of the memory array 302. Row control circuitry 320 receives a group of M row address signals and one or more various control signals from System Control Logic circuit 360, and typically may include such circuits as row decoders 322, array terminal drivers 324, and block select circuitry 326 for both reading and writing operations. Row control circuitry 320 may also include read/write circuitry. Memory die 300 also includes column control circuitry 310 including sense amplifier(s) 330 whose input/outputs 306 are connected to respective bit lines of the memory array 302. In some embodiments, the sense amp(s) contain data latches that store data to be programmed into the memory array 302. Although only single block is shown for array 302, a memory die can include multiple arrays that can be individually accessed. Column control circuitry 310 receives a group of N column address signals and one or more various control signals from System Control Logic 360, and typically may include such circuits as column decoders 312, array terminal receivers or drivers 314, block select circuitry 316, as well as read/write circuitry, and I/O multiplexers. The column control circuitry 310 has temporary data storage 331, which may be used to store data that is received from the memory bus 318 and is to be programmed into the memory array 302. In some embodiments, the data is first transferred from the memory bus 318 to temporary storage 331, and then transferred to latches in the sense amps 330.

System control logic 360 receives data and commands from a host and provides output data and status to the host. In other embodiments, system control logic 360 receives data and commands from a separate controller circuit and provides output data to that controller circuit, with the controller circuit communicating with the host. In some embodiments, the system control logic 360 can include a state machine 362 that provides die-level control of memory operations. In one embodiment, the state machine 362 is programmable by software. In other embodiments, the state machine 362 does not use software and is completely implemented in hardware (e.g., electrical circuits). In another embodiment, the state machine 362 is replaced by a micro-controller or microprocessor, either on or off the memory chip. The system control logic 360 can also include a power control module 364 controls the power and voltages supplied to the rows and columns of the memory structure 302 during memory operations and may include charge pumps and regulator circuit for creating regulating voltages. The system control logic 360 can also include a temperature sensor 372, which is used to sense an operating temperature on the die 300. In some embodiments, the operating temperature is reported to the memory controller 102, which may determine an operating mode (e.g., coupled or decoupled) based at least in part on the temperature.

System control logic 360 includes storage 366, which may be used to store parameters for operating the memory array 302. The storage 366 may include volatile and/or non-volatile storage. The storage 366 may include one or more registers, which may be used to store operating parameters. In one embodiment, the parameters are stored in the memory array 302 and transferred to the storage 366 upon power up of the memory die 300. In one embodiment, the parameters in the storage 366 are used to specify whether program execution is coupled with dataload ("coupled mode) whether program execution is decoupled from dataload ("decoupled mode"). In one embodiment, the operating mode is a feature that has a default value (e.g., coupled mode) and may be set to a different value (e.g., decoupled mode) by the memory controller 102. In one embodiment, the memory controller 102 sets the operating mode by writing to storage 366. For example, the memory controller 102 may write to a register to select either the coupled mode or the decoupled mode. However, another technique may be used such as the memory controller 102 issuing a command sequence on the memory bus 318. In one embodiment, the memory controller 102 may change the operating mode at any time when the memory die 300 is powered on. In one embodiment, the operating mode is established when the die 300 is powered on and is not changed thereafter.

System control logic 360 includes command latches 369, which may be used to latch commands received on the memory bus 318. In one embodiment, a latch is dedicated to a particular type of command.

Commands and data are transferred between the controller 102 and the memory die 300 via memory controller interface 368 (also referred to as a "communication interface"). Memory controller interface 368 is an electrical interface for communicating with memory controller 102. Examples of memory controller interface 368 include a Toggle Mode Interface and an Open NAND Flash Interface (ONFI). Other I/O interfaces can also be used. For example, memory controller interface 368 may implement a Toggle Mode Interface that connects to the Toggle Mode interfaces of memory interface 228/258 for memory controller 102. In one embodiment, memory controller interface 368 includes a set of input and/or output (I/O) pins that connect to the controller 102.

In some embodiments, all the elements of memory die 300, including the system control logic 360, can be formed as part of a single die. In other embodiments, some or all of the system control logic 360 can be formed on a different die.

In one embodiment, memory structure 302 comprises a three-dimensional memory array of non-volatile memory cells in which multiple memory levels are formed above a single substrate, such as a wafer. The memory structure may comprise any type of non-volatile memory that are monolithically formed in one or more physical levels of memory cells having an active area disposed above a silicon (or other type of) substrate. In one example, the non-volatile memory cells comprise vertical NAND strings with charge-trapping.

In another embodiment, memory structure 302 comprises a two-dimensional memory array of non-volatile memory cells. In one example, the non-volatile memory cells are NAND flash memory cells utilizing floating gates. Other types of memory cells (e.g., NOR-type flash memory) can also be used.

The exact type of memory array architecture or memory cell included in memory structure 302 is not limited to the examples above. Many different types of memory array architectures or memory technologies can be used to form memory structure 302. No particular non-volatile memory technology is required for purposes of the new claimed embodiments proposed herein. Other examples of suitable technologies for memory cells of the memory structure 302 include ReRAM memories (resistive random access memories), magnetoresistive memory (e.g., MRAM, Spin Transfer Torque MRAM, Spin Orbit Torque MRAM), FeRAM, phase change memory (e.g., PCM), and the like. Examples of suitable technologies for memory cell architectures of the memory structure 302 include two dimensional arrays, three dimensional arrays, cross-point arrays, stacked two dimensional arrays, vertical bit line arrays, and the like.

One example of a ReRAM cross-point memory includes reversible resistance-switching elements arranged in cross-point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Another example is magnetoresistive random access memory (MRAM) that stores data by magnetic storage elements. The elements are formed from two ferromagnetic layers, each of which can hold a magnetization, separated by a thin insulating layer. One of the two layers is a permanent magnet set to a particular polarity; the other layer's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created. MRAM based memory embodiments will be discussed in more detail below.

Phase change memory (PCM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. In other PCM embodiments, the memory cells are programmed by current pulses. Note that the use of "pulse" in this document does not require a square pulse but includes a (continuous or non-continuous) vibration or burst of sound, current, voltage light, or other wave. These memory elements within the individual selectable memory cells, or bits, may include a further series element that is a selector, such as an ovonic threshold switch or metal insulator substrate.

A person of ordinary skill in the art will recognize that the technology described herein is not limited to a single specific memory structure, memory construction or material composition, but covers many relevant memory structures within the spirit and scope of the technology as described herein and as understood by one of ordinary skill in the art.

The elements of FIG. 3A can be grouped into two parts, the structure of memory structure 302 of the memory cells and the peripheral circuitry, including all of the other elements. An important characteristic of a memory circuit is its capacity, which can be increased by increasing the area of the memory die of storage system 100 that is given over to the memory structure 302; however, this reduces the area of the memory die available for the peripheral circuitry. This can place quite severe restrictions on these peripheral elements. For example, the need to fit sense amplifier circuits within the available area can be a significant restriction on sense amplifier design architectures. With respect to the system control logic 360, reduced availability of area can limit the available functionalities that can be implemented on-chip. Consequently, a basic trade-off in the design of a memory die for the storage system 100 is the amount of area to devote to the memory structure 302 and the amount of area to devote to the peripheral circuitry.

Another area in which the memory structure 302 and the peripheral circuitry are often at odds is in the processing involved in forming these regions, since these regions often involve differing processing technologies and the trade-off in having differing technologies on a single die. For example, when the memory structure 302 is NAND flash, this is an NMOS structure, while the peripheral circuitry is often CMOS based. For example, elements such as sense amplifier circuits, charge pumps, logic elements in a state machine, and other peripheral circuitry in system control logic 360 often employ PMOS devices. Processing operations for manufacturing a CMOS die will differ in many aspects from the processing operations optimized for an NMOS flash NAND memory or other memory cell technologies.

To improve upon these limitations, embodiments described below can separate the elements of FIG. 3A onto separately formed dies that are then bonded together. More specifically, the memory structure 302 can be formed on one die and some or all of the peripheral circuitry elements, including one or more control circuits, can be formed on a separate die. For example, a memory die can be formed of just the memory elements, such as the array of memory cells of flash NAND memory, MRAM memory, PCM memory, ReRAM memory, or other memory type. Some or all of the peripheral circuitry, even including elements such as decoders and sense amplifiers, can then be moved on to a separate die. This allows each of the memory die to be optimized individually according to its technology. For example, a NAND memory die can be optimized for an NMOS based memory array structure, without worrying about the CMOS elements that have now been moved onto a separate peripheral circuitry die that can be optimized for CMOS processing. This allows more space for the peripheral elements, which can now incorporate additional capabilities that could not be readily incorporated were they restricted to the margins of the same die holding the memory cell array. The two die can then be bonded together in a bonded multi-die memory circuit, with the array on the one die connected to the periphery elements on the other memory circuit. Although the following will focus on a bonded memory circuit of one memory die and one peripheral circuitry die, other embodiments can use more dies, such as two memory dies and one peripheral circuitry die, for example.

Figure 3B:
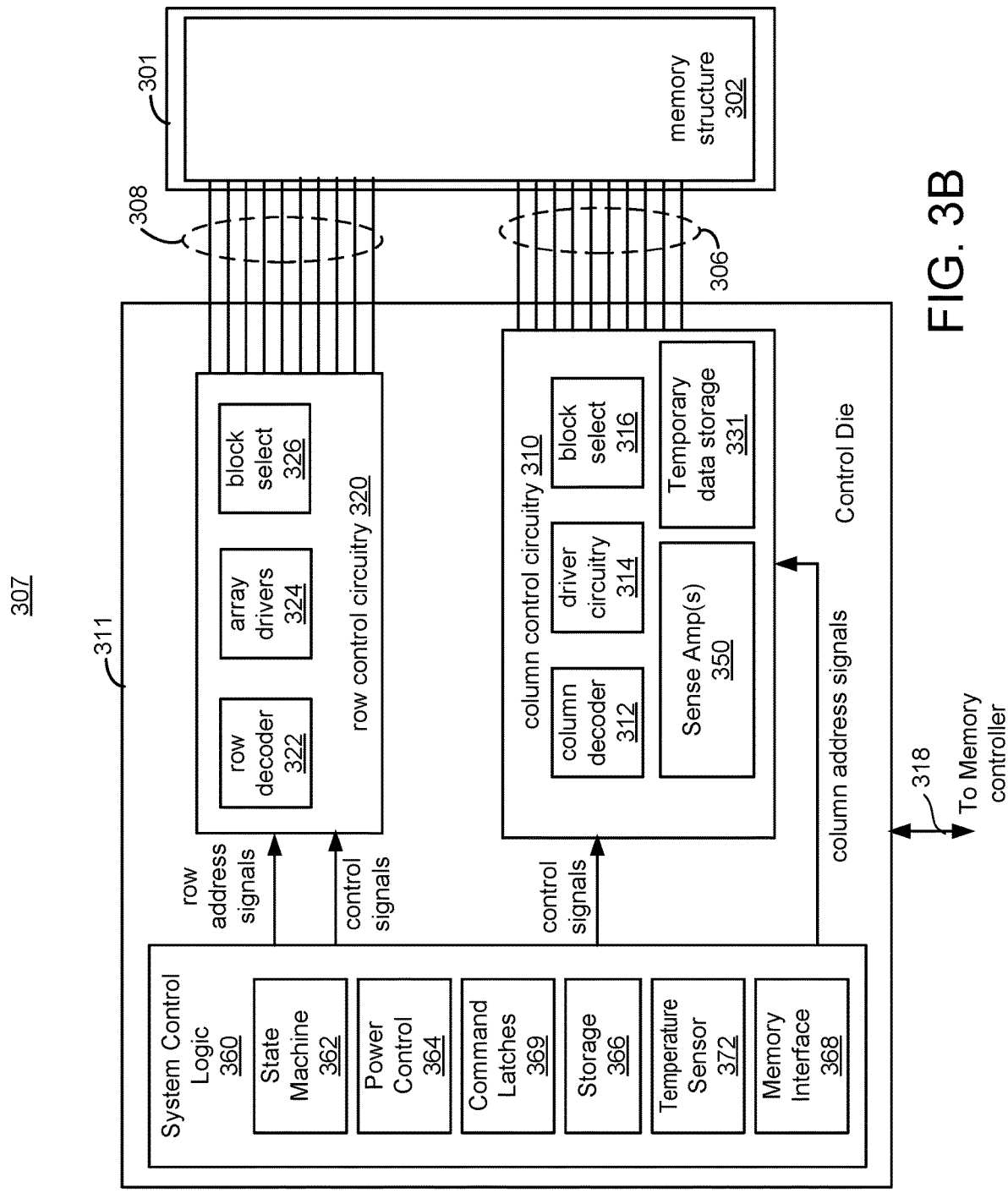
FIG. 3B is a functional block diagram of an embodiment of an integrated memory assembly.

FIG. 3B shows an alternative arrangement to that of FIG. 3A which may be implemented using wafer-to-wafer bonding to provide a bonded die pair. FIG. 3B depicts a functional block diagram of one embodiment of an integrated memory assembly 307. The integrated memory assembly 307 may be used in a memory package 104 in storage system 100. In one embodiment, each memory die 300 in FIG. 2B is replaced by an integrated memory assembly 307. The integrated memory assembly 307 includes two types of semiconductor dies (or more succinctly, "die"). Memory structure die 301 includes memory structure 302. Memory structure 302 may contain non-volatile memory cells. Control die 311 includes control circuitry 360, 310, 320. In some embodiments, the control die 311 is configured to connect to the memory structure 302 in the memory structure die 301. In some embodiments, the memory structure die 301 and the control die 311 are bonded together.

FIG. 3B shows an example of the peripheral circuitry, including control circuits, formed in a peripheral circuit or control die 311 coupled to memory structure 302 formed in memory structure die 301. Common components are labelled similarly to FIG. 3A. System control logic 360, row control circuitry 320, and column control circuitry 310 are located in control die 311. In some embodiments, all or a portion of the column control circuitry 310 and all or a portion of the row control circuitry 320 are located on the memory structure die 301. In some embodiments, some of the circuitry in the system control logic 360 is located on the on the memory structure die 301.

System control logic 360, row control circuitry 320, and column control circuitry 310 may be formed by a common process (e.g., CMOS process), so that adding elements and functionalities, such as ECC, more typically found on a memory controller 102 may require few or no additional process steps (i.e., the same process steps used to fabricate controller 102 may also be used to fabricate system control logic 360, row control circuitry 320, and column control circuitry 310). Thus, while moving such circuits from a die such as memory structure die 301 may reduce the number of steps needed to fabricate such a die, adding such circuits to a die such as control die 311 may not require any additional process steps. The control die 311 could also be referred to as a CMOS die, due to the use of CMOS technology to implement some or all of control circuitry 360, 310, 320.

FIG. 3B shows column control circuitry 310 including sense amplifier(s) 350 on the control die 311 coupled to memory structure 302 on the memory structure die 301 through electrical paths 306. For example, electrical paths 306 may provide electrical connection between column decoder 312, driver circuitry 314, and block select 316 and bit lines of memory structure 302. Electrical paths may extend from column control circuitry 310 in control die 311 through pads on control die 311 that are bonded to corresponding pads of the memory structure die 301, which are connected to bit lines of memory structure 302. Each bit line of memory structure 302 may have a corresponding electrical path in electrical paths 306, including a pair of bond pads, which connects to column control circuitry 310. Similarly, row control circuitry 320, including row decoder 322, array drivers 324, and block select 326 are coupled to memory structure 302 through electrical paths 308. Each of electrical path 308 may correspond to a word line, dummy word line, or select gate line. Additional electrical paths may also be provided between control die 311 and memory structure die 301.

For purposes of this document, the phrase "one or more control circuits" can include one or more of memory controller 102, system control logic 360, column control circuitry 310, row control circuitry 320, a micro-controller, a state machine, and/or other control circuitry, or other analogous circuits that are used to control non-volatile memory. The one or more control circuits can include hardware only or a combination of hardware and software (including firmware). For example, a controller programmed by firmware to perform the functions described herein is one example of a control circuit. A control circuit can include a processor, FPGA, ASIC, integrated circuit, or other type of circuit.

For purposes of this document, the term apparatus may include, but is not limited to, non-volatile storage system 100, memory controller 102, memory package 104, memory die 300, control die 311, integrated memory assembler 307, a micro-controller, a state machine, and/or other control circuitry, or other analogous circuits that are used to control non-volatile memory. The apparatus can include hardware only or a combination of hardware and software (including firmware).

Figure 4A:
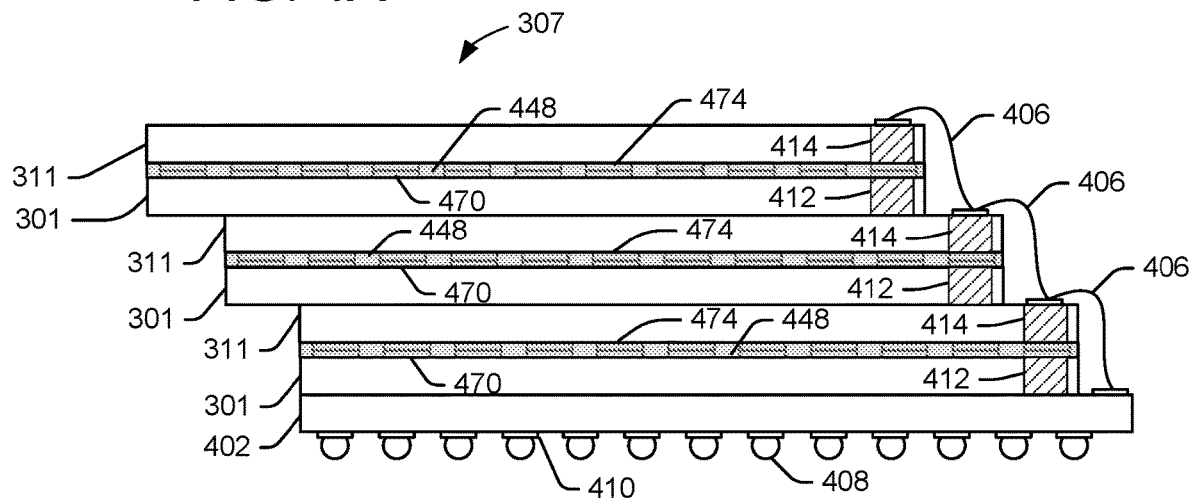
FIG. 4A depicts a side view of an embodiment of an integrated memory assembly stacked on a substrate.

In some embodiments, there is more than one control die 311 and more than one memory structure die 301 in an integrated memory assembly 307. In some embodiments, the integrated memory assembly 307 includes a stack of multiple control dies 311 and multiple memory structure dies 301. FIG. 4A depicts a side view of an embodiment of an integrated memory assembly 307 stacked on a substrate 402 (e.g., a stack comprising control dies 311 and memory structure dies 301). The integrated memory assembly 307 has three control dies 311 and three memory structure dies 301. In some embodiments, there are more than three memory structure dies 301 and more than three control dies 311.

Each control die 311 is affixed (e.g., bonded) to at least one of the memory structure dies 301. Some of the bond pads 470, 474, are depicted. There may be many more bond pads. A space between two dies 301, 311 that are bonded together is filled with a solid layer 448, which may be formed from epoxy or other resin or polymer. This solid layer 448 protects the electrical connections between the dies 301, 311, and further secures the dies together. Various materials may be used as solid layer 448, but in embodiments, it may be Hysol® epoxy resin from Henkel® Corp., having offices in California, USA.

The integrated memory assembly 307 may for example be stacked with a stepped offset, leaving the bond pads at each level uncovered and accessible from above. Wire bonds 406 connected to the bond pads connect the control die 311 to the substrate 402. A number of such wire bonds may be formed across the width of each control die 311 (i.e., into the page of FIG. 4A).

A memory structure die through silicon via (TSV) 412 may be used to route signals through a memory structure die 301. A control die through silicon via (TSV) 414 may be used to route signals through a control die 311. The TSVs 412, 414 may be formed before, during or after formation of the integrated circuits in the semiconductor dies 301, 311. The TSVs may be formed by etching holes through the wafers. The holes may then be lined with a barrier against metal diffusion. The barrier layer may in turn be lined with a seed layer, and the seed layer may be plated with an electrical conductor such as copper, although other suitable materials such as aluminum, tin, nickel, gold, doped polysilicon, and alloys or combinations thereof may be used.

Solder balls 408 may optionally be affixed to contact pads 410 on a lower surface of substrate 402. The solder balls 408 may be used to couple the integrated memory assembly 307 electrically and mechanically to a host device such as a printed circuit board. Solder balls 408 may be omitted where the integrated memory assembly 307 is to be used as an LGA package. The solder balls 408 may form a part of the interface between the integrated memory assembly 307 and the memory controller 102.

Figure 4B:
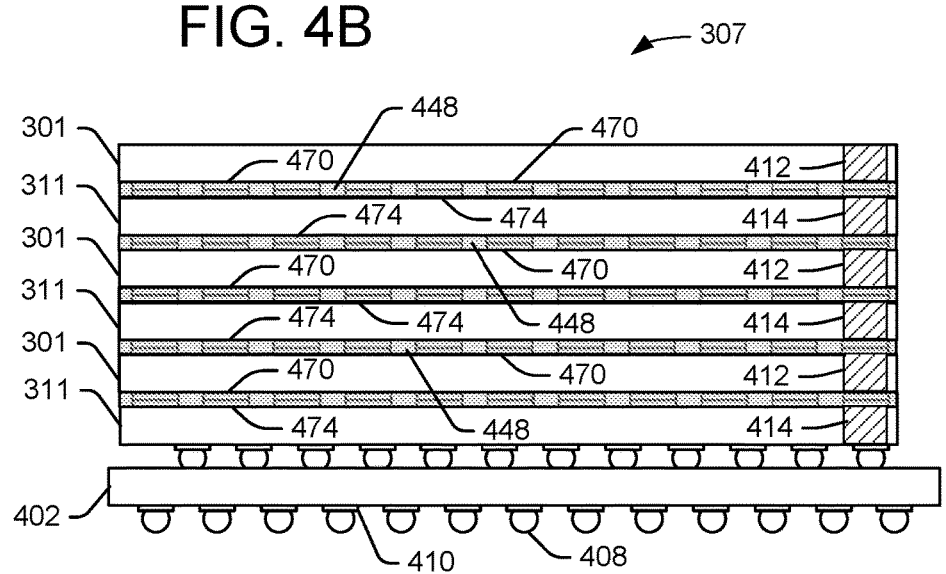
FIG. 4B depicts a side view of an embodiment of an integrated memory assembly stacked on a substrate.

FIG. 4B depicts a side view of an embodiment of an integrated memory assembly 307 stacked on a substrate 402. The integrated memory assembly 307 has three control dies 311 and three memory structure dies 301. In some embodiments, there are many more than three memory structure dies 301 and many more than three control dies 311. In this example, each control die 311 is bonded to at least one memory structure die 301. Optionally, a control die 311 may be bonded to two memory structure dies 301.

Some of the bond pads 470, 474 are depicted. There may be many more bond pads. A space between two dies 301, 311 that are bonded together is filled with a solid layer 448, which may be formed from epoxy or other resin or polymer. In contrast to the example in FIG. 4A, the integrated memory assembly 307 in FIG. 4B does not have a stepped offset. A memory structure die through silicon via (TSV) 412 may be used to route signals through a memory structure die 301. A control die through silicon via (TSV) 414 may be used to route signals through a control die 311.

Solder balls 408 may optionally be affixed to contact pads 410 on a lower surface of substrate 402. The solder balls 408 may be used to couple the integrated memory assembly 307 electrically and mechanically to a host device such as a printed circuit board. Solder balls 408 may be omitted where the integrated memory assembly 307 is to be used as an LGA package.

As has been briefly discussed above, the control die 311 and the memory structure die 301 may be bonded together. Bond pads on each die 301, 311 may be used to bond the two dies together. In some embodiments, the bond pads are bonded directly to each other, without solder or other added material, in a so-called Cu-to-Cu bonding process. In a Cu-to-Cu bonding process, the bond pads are controlled to be highly planar and formed in a highly controlled environment largely devoid of ambient particulates that might otherwise settle on a bond pad and prevent a close bond. Under such properly controlled conditions, the bond pads are aligned and pressed against each other to form a mutual bond based on surface tension. Such bonds may be formed at room temperature, though heat may also be applied. In embodiments using Cu-to-Cu bonding, the bond pads may be about 5 µm square and spaced from each other with a pitch of 5 µm to 5 µm. While this process is referred to herein as Cu-to-Cu bonding, this term may also apply even where the bond pads are formed of materials other than Cu.

When the area of bond pads is small, it may be difficult to bond the semiconductor dies together. The size of, and pitch between, bond pads may be further reduced by providing a film layer on the surfaces of the semiconductor dies including the bond pads. The film layer is provided around the bond pads. When the dies are brought together, the bond pads may bond to each other, and the film layers on the respective dies may bond to each other. Such a bonding technique may be referred to as hybrid bonding. In embodiments using hybrid bonding, the bond pads may be about 5 µm square and spaced from each other with a pitch of 1 µm to 5 µm. Bonding techniques may be used providing bond pads with even smaller sizes and pitches.

Some embodiments may include a film on surface of the dies 301, 311. Where no such film is initially provided, a space between the dies may be under filled with an epoxy or other resin or polymer. The under-fill material may be applied as a liquid which then hardens into a solid layer. This under-fill step protects the electrical connections between the dies 301, 311, and further secures the dies together. Various materials may be used as under-fill material, but in embodiments, it may be Hysol® epoxy resin from Henkel® Corp., having offices in California, USA.

Figure 5:
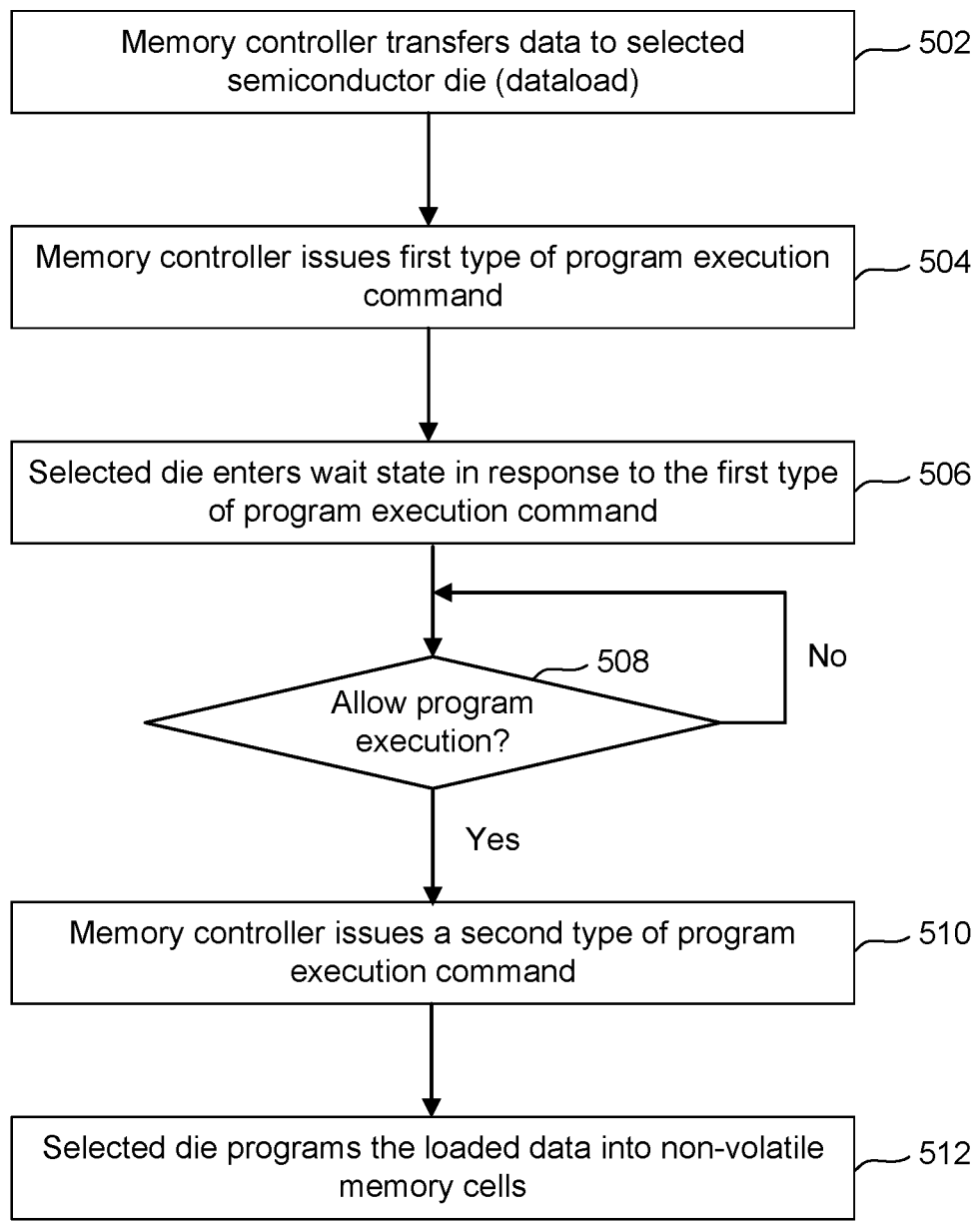
FIG. 5 is a flowchart of one embodiment of a process of programming data in a non-volatile storage system.

FIG. 5 is a flowchart of one embodiment of a process 500 of programming data in a non-volatile storage system. The process 500 is performed when the selected semiconductor die is in a mode of operation in which program execution is decoupled from dataload. In an embodiment, the selected semiconductor die is a memory die 300 (see FIG. 3A) that contains a memory array 302 having non-volatile memory cells, as well as one or more control circuits that program data into the non-volatile memory cells. In an embodiment, the selected semiconductor die is a control die 311 (see FIG. 3B) that is configured to connect to a memory structure die 301 having non-volatile memory cells. The control die 311 has one or more control circuits that program data into the non-volatile memory cells on the memory structure die 301. The process 500 may be used for programming one bit per memory cell, which is referred to as SLC (single level cell) or programming multiple bits per memory cell, which is referred to as MLC (multi-level cell). The process 500 may be used for programming one plane on the selected die or multiple planes on the selected die.

Step 502 includes transferring data to the selected semiconductor die. In an embodiment, the memory controller 102 places the data onto the memory bus 318. In an embodiment, the data is transferred over a Toggle Mode interface. The selected semiconductor die may initially load the data into temporary data storage 311 in the semiconductor die. The data could include one or more pages of data, with each page being 16 KB as one example. The selected semiconductor die may transfer that data into latches in sense amplifiers 330.

Step 504 includes the memory controller 102 issuing a first type of program execution command. In an embodiment, the memory controller 102 places the program execution command onto the memory bus 318. A "program execution command," as defined herein is a command that under at least one condition will cause a die to commit (e.g., program) data to non-volatile memory cells. The first type of program execution command is a command that would cause the selected semiconductor die to commit (e.g., immediately program) the data into non-volatile memory cells if the selected semiconductor die is in a mode of operation in which program execution is coupled to dataload. In an embodiment, the first type of program execution command is 10h or 15h in the ONFI specification. The first type of program execution command of step 504 may be referred to herein as a "normal program execution command."

Step 506 includes the selected semiconductor die entering a wait state upon accessing the first type of program execution command from the memory bus 318. Hence, the selected semiconductor die does not immediately commit (e.g., program) the data into non-volatile memory cells as it would if it were in the mode in which program execution is coupled to dataload.

Step 508 includes the memory controller 102 determining whether to allow the selected semiconductor die to execute the program operation. That is, the memory controller 102 determines whether the selected semiconductor die should program the data into non-volatile memory cells at the present time. In an embodiment, the memory controller 102 considers the thermal budget. The program execution phase may exceed a present thermal budget, in which case the memory controller 102 may wait until the thermal budget allows the program execution. Waiting in step 508 helps to prevent thermal runaway. In some embodiments, the memory controller 102 uses a power token scheme to determine whether to allow the program execution to occur. In an embodiment of a power token scheme, there is a token pool that may be managed by the memory controller 102. The token pool is used to regulate when memory operations are performed for power and/or thermal management. The size of the token pool may change in size over time based on factors such as temperature (e.g., thermal throttling) and how much power is presently being consumed by memory operations. Each memory operation (or portion thereof) may be allocated a token based on how much power it is expected to consume. In one embodiment, when the memory controller 102 instructs a die to perform a memory operation (or portion thereof) the token pool is reduced based on the amount of power that will be consumed by performing the memory operation (or portion thereof). This may be managed by removing a token from the pool during execution of the memory operation and putting the token back in the pool after execution of the memory operation. The memory controller 102 may wait in step 508 depending on the present size of the token pool. Therefore, the memory controller 102 may determine whether to permit the program execution based on the amount of power that program execution is expected to consume and the present size of the token pool.

Optionally, the memory controller 102 could instruct another semiconductor die to perform a memory operation (e.g., read, dataload portion of write) during this wait period in step 508. For example, if another memory operation that is queued in the scheduler (see 228, FIG. 2A) consumes less power than the program execution, then the memory controller 102 may allow the other memory operation to proceed during the wait of step 508. However, the program operation could time out if the memory controller 102 waits too long in step 508. Therefore, in embodiments of step 508 the memory controller 102 will avoid allowing the program operation to time out.

Step 510 includes the memory controller 102 issuing a second type of program execution command to the selected semiconductor die. The second type of program execution command has a different code than the first type of program execution command. For example, if the first type of program execution command is 10h, then the second type of program execution command is not 10h. In one embodiment, this second type of program execution command is a vender specific command for the ONFI specification. Step 510 may also include the memory controller 102 re-selecting the memory die. The program execution command of step 510 instructs the selected semiconductor die to program the data into non-volatile memory cells.

Step 512 includes the selected semiconductor die programming the data into non-volatile memory cells. In one embodiment, one or more control circuits on a memory die 300 program non-volatile memory cells in memory array 302. In one embodiment, one or more control circuits on a control die 311 program non-volatile memory cells in memory array 302 on a memory structure die 301. Thus, the selected semiconductor die programs the data into the non-volatile memory cells.

Figure 6:
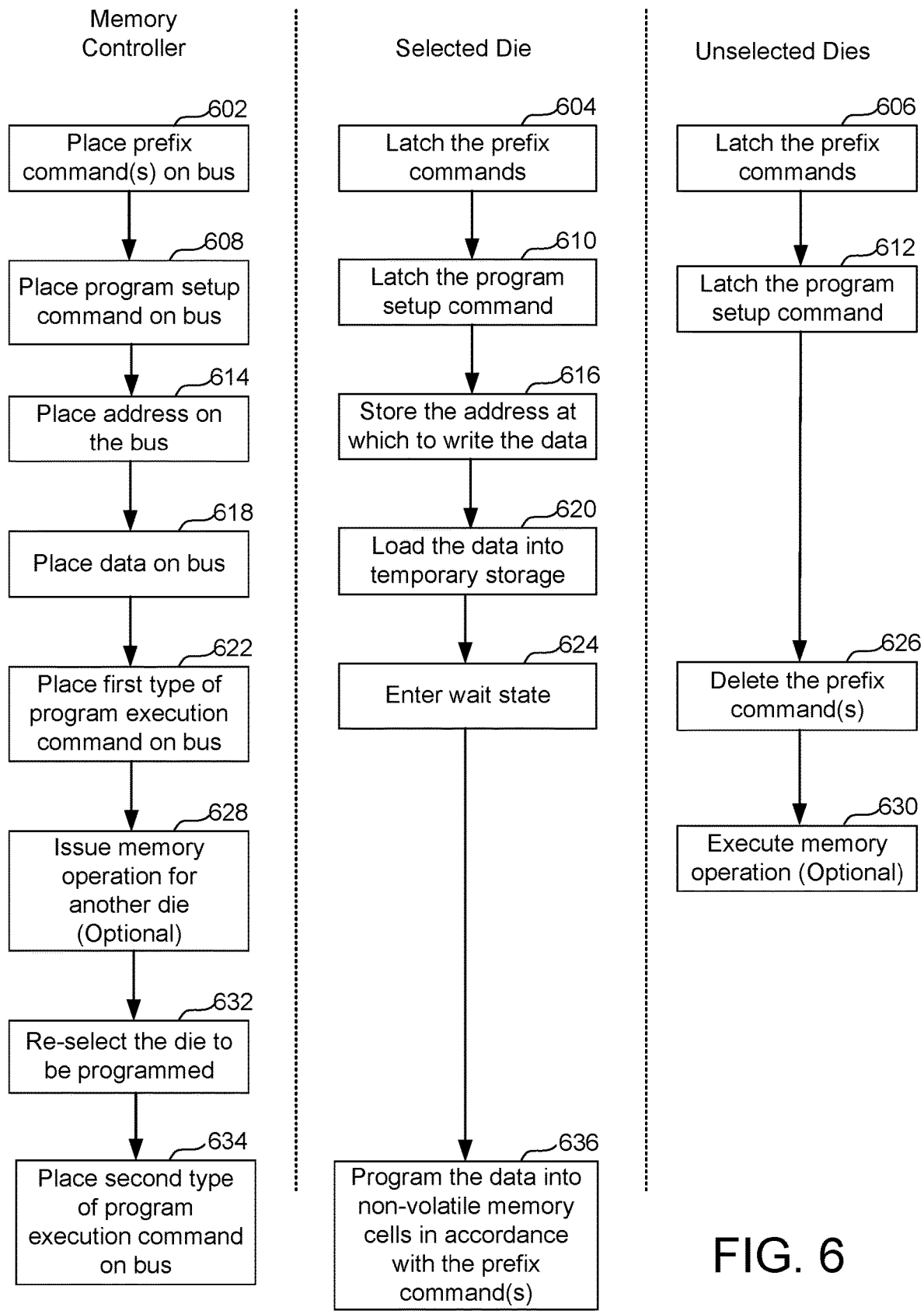
FIG. 6 is a flow diagram of one embodiment of a process of operating non-volatile storage in which program execution is decoupled from dataload.

FIG. 6 is a flow diagram of one embodiment of a process of operating non-volatile storage in which program execution is decoupled from dataload. The flow diagram depicts actions performed by the memory controller 102, a selected semiconductor die, and unselected semiconductor dies. The selected semiconductor die refers to the die that is selected to perform the program operation. The selected semiconductor die and the unselected semiconductor dies are connected to a common memory bus 318. In an embodiment, each of the semiconductor dies is a memory die 300 (see FIG. 3A). In an embodiment, each of the semiconductor dies is a control die 311 (see FIG. 3B).

Figure 7:
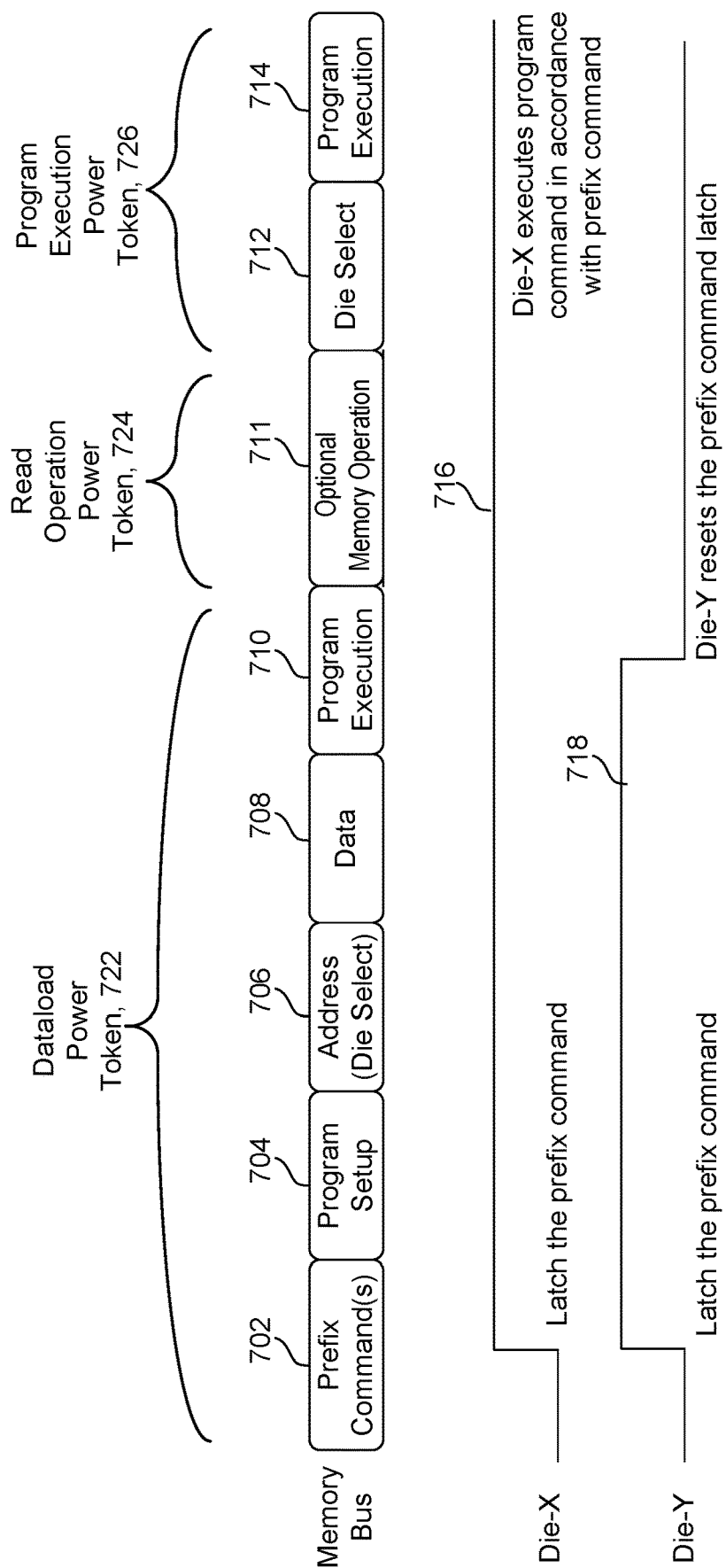
FIG. 7 is one embodiment of a sequence for a command/data transfer for a program operation in which program execution is decoupled from dataload.

In step 602, the memory controller 102 places one or more prefix commands 702 onto the memory bus 318. A prefix command 702 may be used to provide a condition for the program operation. For example, a prefix command may be used to adjust the target threshold voltages to which NAND memory cells are programmed. This may be achieved by specifying verify reference voltage levels for the program verify stage. FIG. 7 depicts one embodiment of a sequence for a command/data transfer for a program operation in which program execution is decoupled from dataload. The sequence for the command/data transfer will be described with the flow diagram of FIG. 6. In FIG. 7, Die-X is the selected die and Die-Y is representative of the unselected dies. All of the semiconductor dies that are connected to the memory bus 318 will latch the prefix command(s) into latches on the respective dies (steps 604, 606 of FIG. 6). Note that at this time, none of the dies has been selected. Therefore, any of the dies could potentially be selected for the program operation. Hence, each die latches the prefix command(s) in the event that it is selected for the program operation. With reference to FIG. 7, line 716 goes high when the prefix command 702 is on the memory bus 318 to indicate the latching of the prefix command on Die-X. Likewise, line 718 goes high when the prefix command 702 is on the memory bus 318 to indicate the latching of the prefix command on Die-Y. In an embodiment, each die has a number of latches for the prefix commands, such that each latch is dedicated to a specific type of prefix command.

In step 608 in FIG. 6, the memory controller 102 places a program setup command 704 on the memory bus 318. The program setup command 704 informs the die that a program operation with a dataload is about to be issued on the memory bus 318. Examples for the program setup command include, but are not limited to, 80h or 85h in the ONFI specification. The respective dies may latch the program setup command 704 (steps 610, 612 in FIG. 6).

In step 614, the memory controller 102 places the address 706 on the memory bus 318. This is the address at which the data is to be programmed. The address may specify a group of memory cells in a selected memory die 300 (see FIG. 3A) or a selected memory structure die 301 (see FIG. 3B). The address may include a column address, a plane address, a word line address, a block address, and a die address. Because the address includes a die address it may serve to select one of the dies. As noted above, the selected die in FIG. 6 refers to the die that is selected to perform the program operation. Note that in the architecture of the integrated memory assembly 307 (see FIG. 3B), the control die 311 that is to program cells in the memory structure die 301 may be referred to as the selected die. In step 616, the selected die stores the address.

In step 618, the memory controller 102 places the data onto the memory bus 318. This data could be, for example, one or more pages of data. Each page may be 16 KB, for example. Since the memory bus 318 width is much less than a page, the data is typically transferred over many clock cycles. In step 620, the selected die loads the data into temporary storage (e.g., storage 331, FIG. 3A) on the selected die. With reference to FIG. 7, Die-X will load the data into temporary storage on Die-X, which is referred to herein as dataload. However, Die-X does not yet program the data into the non-volatile memory cells. After step 618, the memory controller may repeat steps 608, 614, and 618 so that the selected die may load other data for other addresses. For example, multiple planes on a memory die can be programmed, in which case steps 608-620 may be repeated to load data for other planes.

In step 622, the memory controller 102 places a first type of program execution command onto the memory bus 318. In step 624, the selected die enter a wait state. The first type of program execution command would, if the die is in the coupled mode, cause the selected die to immediately program the data into non-volatile memory cells. Stated another way, the program execution command would, if the die is in the coupled mode, cause the selected die to commit the data into the memory array 302. However, because Die-X is in the mode in which program execution is decoupled from dataload, Die-X does not program the data into the non-volatile memory cells in response to the program execution command. Instead, Die-X enters a wait state. Examples for the program execution command include, but are not limited to, 10h or 15h in the ONFI specification.

In step 626, the unselected dies delete the prefix command(s). With reference to FIG. 7, Die-Y will reset it prefix command latch(es), as indicated by the line 718 going low in response to the program execution command 710. By resetting the prefix command latch(es) operation of another memory operation at Die-Y is not compromised. Note that Die-X will not reset it prefix command latch(es) in response to the program execution command 710, as indicated by line 716 staying high at that time. The unselected dies may also delete the program setup 704 command, if the program setup command 704 was latched.

In optional step 628, the memory controller 102 issues a memory operation to another die. For example, one of the previously unselected dies may be selected to perform a read operation. In optional step 630, that previously unselected die will perform the memory operation. FIG. 7 depicts an example in which the memory operation 711 is a read operation, but this could be a different memory operation. In one embodiment, the optional memory operation 711 is the dataload stage of a program operation on Die-Y.

In step 632, the memory controller 102 reselects the die that is to be programmed. Thus, after determining that Die-X should program the data, the memory controller 102 reselects Die-X with a die select command. Referring to FIG. 7, a Die Select 712 is placed on memory bus 318.

In step 634, the memory controller 102 places a second type of program execution command onto the memory bus 318. Referring to FIG. 7, a second type of program execution command 714 is placed on memory bus 318. In an embodiment, this is a vendor specific command in the ONFI specification. In response, Die-X will program the data into the non-volatile memory cells in accordance with the prefix command(s), in step 636.

FIG. 7 also has labels for several power tokens that may be associated with the sequence on the memory bus. In the power token example in FIG. 7, the memory controller 102 allocates a dataload power token 722 for the dataload stage of the program operation, a read operation power token 724 for the memory operation 711, and a program execution power token 726 for the program execution stage of the program operation. Each of these power tokens may have different values. In some cases, the program execution power token 726 will have a larger value than the others due to the actual programming of the data into the non-volatile memory cells being a power intensive process. Also note that the read operation power token 724 is one example. Another example is to have a dataload power token for loading data for a program operation on Die-Y. Performing a memory operation 711 while Die-X waits is optional. Moreover, it is possible to insert more than one memory operation between the dataload and program execution (i.e., during the wait state of Die-X).

In some embodiments, a semiconductor die has one mode of operation in which dataload is coupled to program execution and another mode of operation in which dataload is decoupled from program execution. In an embodiment, the memory controller 102 is able to control which mode of operation the die is in and to change the mode of operation. In some embodiments, the memory controller selects the operating mode based on power and/or temperature considerations. For example, when the memory system is at normal temperature, the memory controller 102 operates the system in a coupled mode that allows full power usage to achieve high performance. However, if the temperature increases beyond a temperature threshold, then threshold thermal throttling may be triggered. During thermal throttling, the memory controller 102 may operate the system in a decoupled mode.

Figure 8:
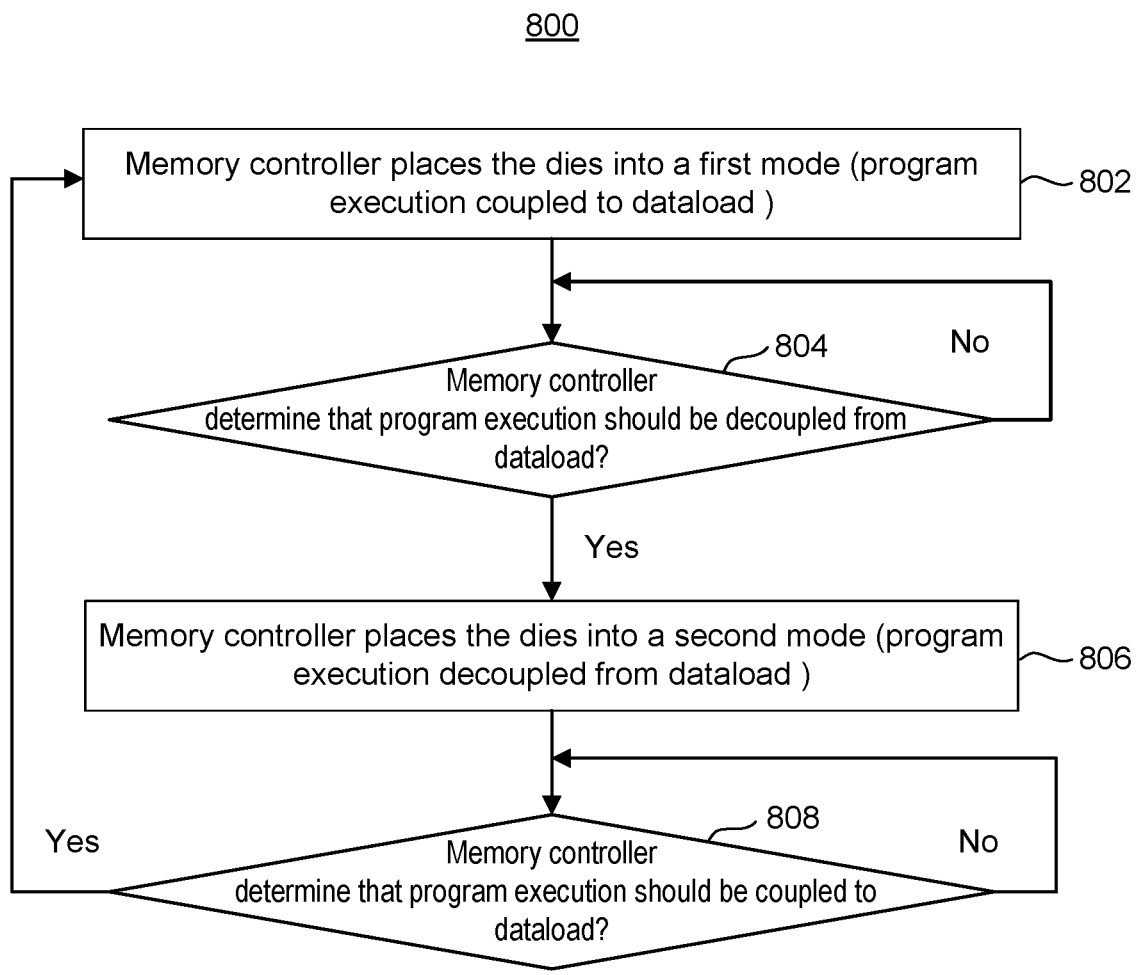
FIG. 8 is a flowchart of one embodiment of a process of controlling an operating mode of a group of dies.

FIG. 8 is a flowchart of one embodiment of a process 800 of controlling an operating mode of a group of semiconductor dies. In process 800, all of the dies that are connected to the same memory bus 318 are placed into the same operating mode. Step 802 includes the memory controller 102 places the dies into a first mode in which dataload is coupled to program execution. In one embodiment, the memory controller 102 writes to a register on each die to set the operating mode. In one embodiment, the memory controller 102 issues one or more commands on the memory bus 318 to set the operating mode.

In one embodiment, the command/data sequence in this coupled mode is the sequence depicted in FIG. 7 between the prefix command 702 and the first type of program execution command 710. The first type of program execution command 710 will cause the selected memory die to program the non-volatile memory cells when in the coupled mode. Thus, the same sequence 702-710 may be used in this coupled mode, but with the die select 712 and second type of program execution command 714 not being used. Using the same sequence 702-710 in both the coupled and uncoupled modes simplifiers the firmware in an embodiment of the memory controller 102.

Step 804 includes a determination by the memory controller 102 of whether program execution should be decoupled from dataload. In one embodiment, the memory controller 102 basis this decision on the temperature of the memory dies. For example, when the operating temperature is higher than a threshold temperature, the decoupled mode may be used. In some embodiments, the decoupled mode is used when the memory system employs thermal throttling.

Step 806 includes the memory controller 102 placing the dies into a second mode in which program execution is decoupled from dataload. In one embodiment, the memory controller 102 writes to a register on each die to change the operating mode.

In some embodiments, the memory system uses a different power token scheme in the decoupled mode than when in the coupled mode. For example, when in the coupled mode, power tokens for a program operation have a value that is large enough for a single token to cover the entire dataload and program execution. However, when in the decoupled mode, power tokens used for a program operation may have a smaller value that is not large enough for a single token to cover the entire dataload and program execution. Instead, one power token may be used for the dataload and another power token may be used for the program execution when in the decoupled mode. For example, in FIG. 7, the dataload power token 722 covers the dataload and the program execution power token 726 covers the program execution. In an embodiment of the coupled mode, a single power token is used for both the dataload and the program execution. Therefore, using two power tokens for a program operation in an embodiment of the decoupled mode provides for finer grained control of power and/or thermal regulation.

Step 808 includes a determination by the memory controller 102 of whether program execution should be coupled to dataload. In one embodiment, the memory controller 102 bases this decision on the temperature of the memory dies. For example, when the operating temperature is low, the coupled mode may be used. If the memory controller 102 determines that the coupled mode is to be used, then the memory controller 102 places the dies into the coupled mode, in step 802.

Figure 9:
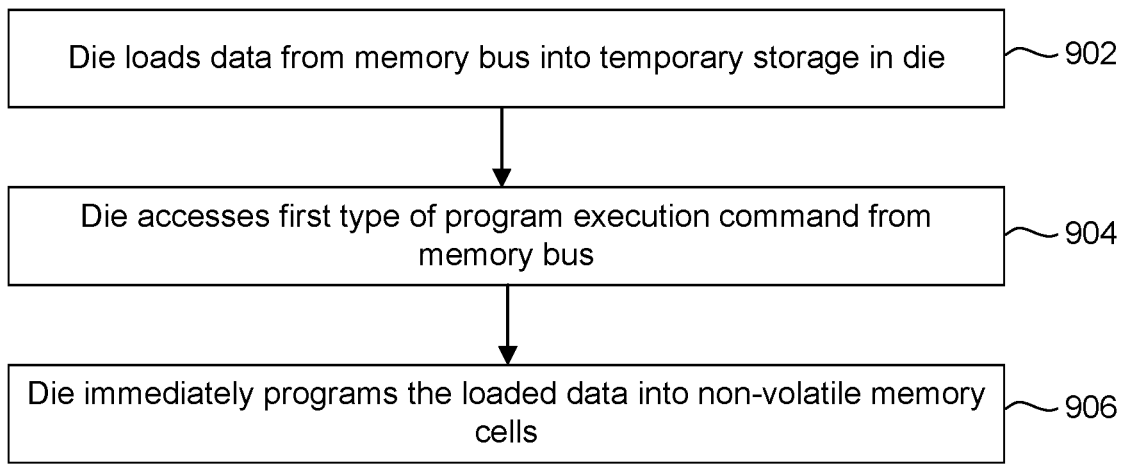
FIG. 9 is a flowchart of one embodiment of a process of a semiconductor die operating in mode in which program execution is coupled to dataload.

FIG. 9 is a flowchart of one embodiment of a process 900 of a semiconductor die operating in mode in which program execution is coupled to dataload. In one embodiment, the semiconductor die is a memory die 300. In one embodiment, the semiconductor die is a control die 311. In an embodiment, process 900 is performed after the memory controller 102 has placed the die into the coupled mode (see step 802 of FIG. 8, for example). The process 900 is simplified and does not describe all details. Step 902 includes the semiconductor die loading data from the memory bus 318 into temporary storage on the die. With reference to FIG. 7, step 902 corresponds to accessing the data 708. Step 904 includes the die accessing a first type of program execution command. In an embodiment, the first type of program execution is 10h in the ONFI specification. In an embodiment, the first type of program execution is 15h in the ONFI specification. With reference to FIG. 7, step 904 corresponds to accessing the first type of program execution command 710. Step 906 includes the die immediately programming the loaded data into non-volatile memory cells.

Figure 10:
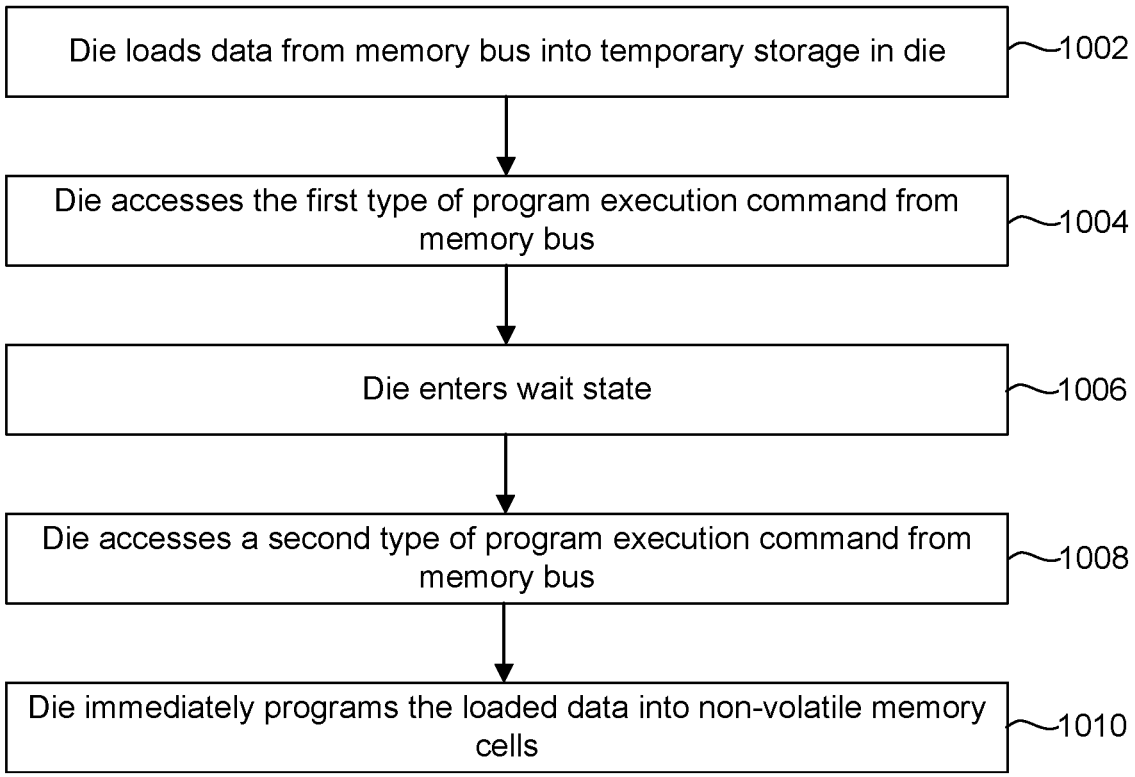
FIG. 10 is a flowchart of one embodiment of a process of a semiconductor die operating in mode in which program execution is decoupled from dataload.

FIG. 10 is a flowchart of one embodiment of a process 1000 of a semiconductor die operating in mode in which program execution is decoupled from dataload. In one embodiment, the semiconductor die is a memory die 300. In one embodiment, the semiconductor die is a control die 311. The process 1000 may be performed after the memory controller 102 has placed the die into the decoupled mode (see step 806 of FIG. 8, for example). The process 1000 is simplified and does not describe all details. Step 1002 includes the die loading data from the memory bus 318 into temporary storage on the die. With reference to FIG. 7, step 1002 corresponds to accessing the data 708. Step 1004 includes the die accessing the first type of program execution command. With reference to FIG. 7, step 1004 corresponds to accessing the first type of program execution command 710. This is the same type of program access command that was referred to in step 904 of FIG. 9. For example, if the command was a 10h command in the ONFI specification in step 904 then the command is also 10h command in the ONFI specification in step 1004. As another example, if the command was a 15h command in the ONFI specification in step 904 then the command is also a 15h command in the ONFI specification in step 1004. Step 1006 includes the die entering a wait state. Thus, the die responds differently to the first type of program execution command in the decoupled mode than when in the coupled mode. However, using the same type of program execution command in the coupled mode and the decoupled mode simplifies operation for the memory controller 102 and the unselected dies. For example, with reference to FIG. 7, the unselected dies will reset the prefix command latch in both the coupled mode and the decoupled mode, thereby assuring consistent operation across the two modes. In other words, the unselected dies will behave in the same manner in the coupled mode and the decoupled mode due to the sequence of command/data (see sequence 702-710 in FIG. 7) being the same in both modes. Moreover, having the same sequence of command/data (see sequence 702-710 in FIG. 7) for both modes simplifies the operation of the memory controller 102. For example, the firmware in an embodiment of the memory controller 102 is simplified.

Step 1008 includes the die accessing a second type of program execution command from the memory bus 318. In an embodiment, the second type of program execution command is a vender specific command, and is not the same type of program execution command that was used in step 1004. For example, the second type of program execution command may be a vendor specific command permitted by the ONFI specification. Step 1010 includes the die immediately programming the loaded data into non-volatile memory cells in response to accessing the second type of program execution command.

Figure 11:
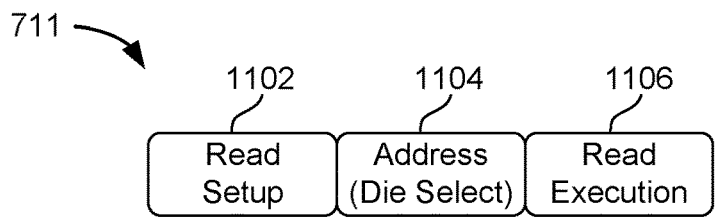
FIG. 11 is an example of an optional memory operation that may be performed between the dataload and program execution phases of a program operation.
Figure 12:
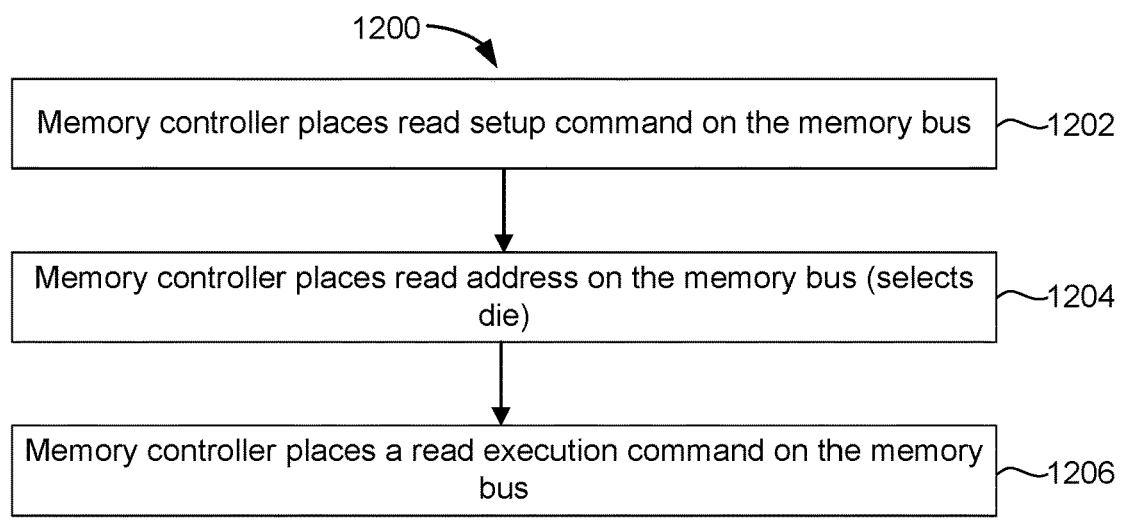
FIG. 12 depicts a flowchart of one embodiment of a process of actions of the memory controller during the memory operation.

As noted above, the memory controller 102 may issue one or more memory operations between the dataload and decoupled program execution. FIG. 11 is an example of an optional memory operation 711 that may be performed between the dataload and program execution stages of a program operation. The memory operation 711 is a read in this example, but could be a different type of memory operation. FIG. 11 depicts what is on the memory bus 318. FIG. 12 depicts a flowchart of one embodiment of a process 1200 of actions of the memory controller 102 during the memory operation. Step 1202 includes the memory controller 102 placing a read setup command 1102 on the memory bus 318. An example of the read setup command is 00h in the ONFI specification. Step 1204 includes the memory controller 102 placing a read address 1104 on the memory bus 318. The address may include a column address, a plane address, a word line address, a block address, and a die address. The read address 1104 includes a die address and therefore selects the die that will control the read operation. Step 1206 includes the memory controller 102 placing a read execution command on the memory bus 318. An example of the read execution command is 30h in the ONFI specification.

Figure 13:
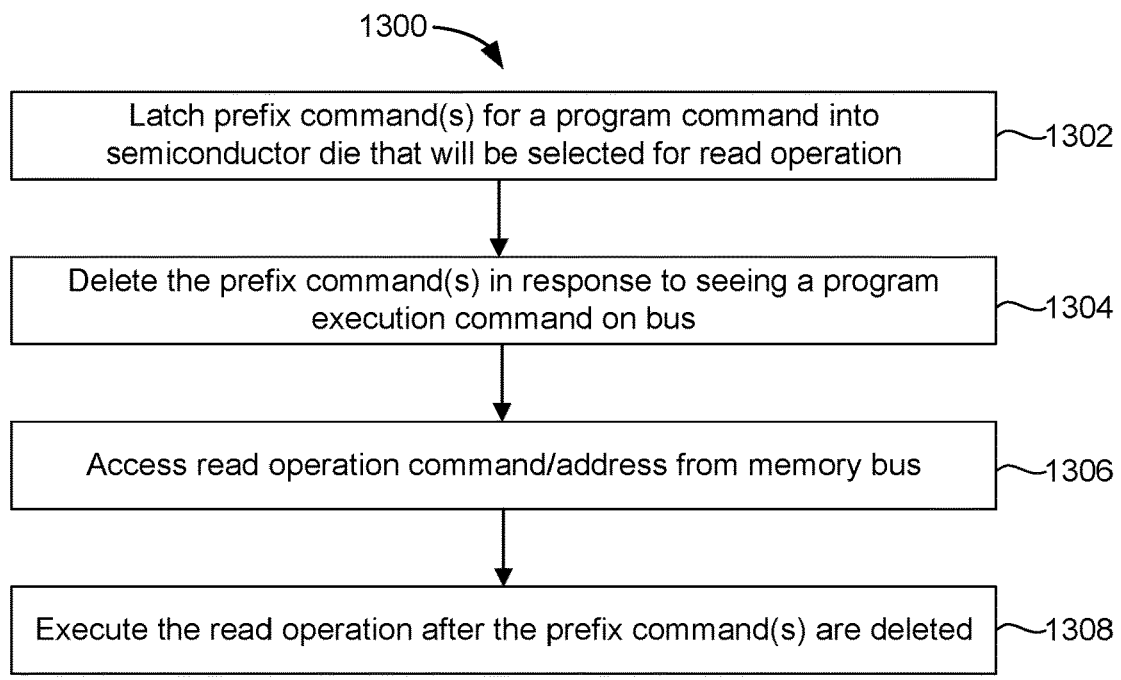
FIG. 13 is a flowchart of one embodiment of a process of actions performed by a die that is selected for the read operation that is performed between the dataload and program execution of the decoupled program operation.

FIG. 13 is a flowchart of one embodiment of a process 1300 of actions performed by a die that is selected to perform the read operation that is performed between the dataload and program execution of the decoupled program operation. However, this die was not selected to perform the program operation. In an embodiment, the selected die is a memory die 300 (see FIG. 3A). In an embodiment, the selected die is a control die 311 (see FIG. 3B). Step 1302 includes the die that will be selected for the read operation latching the prefix command(s) for the program command. With reference to FIG. 7 an example of this is Die-Y latching the prefix command 702. Step 1304 includes deleting the prefix command(s) from the die that will be selected for the read operation in response to seeing a program execution command. With reference to FIG. 7 an example of this is Die-Y resetting the prefix command latch in response to the first type of program execution command 710. Step 1306 includes accessing the read operation command/address 711 from the memory bus 318. The die will understand it is selected based on the address 1104. Step 1308 includes the selected die executing the read command after the prefix command(s) are deleted. Note that if the prefix command(s) were not deleted they could potentially interfere with proper operation of the read operation. Thus, deleting the prefix command(s) in step 1304 avoids this issue.

Although FIGS. 11-13 were discussed using an example in which the memory operation between the dataload and program execution is a read operation, other memory operations may be inserted between the dataload and program execution. In one embodiment, a dataload stage of a program operation of Die-Y is inserted between the dataload and program execution of Die-X.

Figure 14:
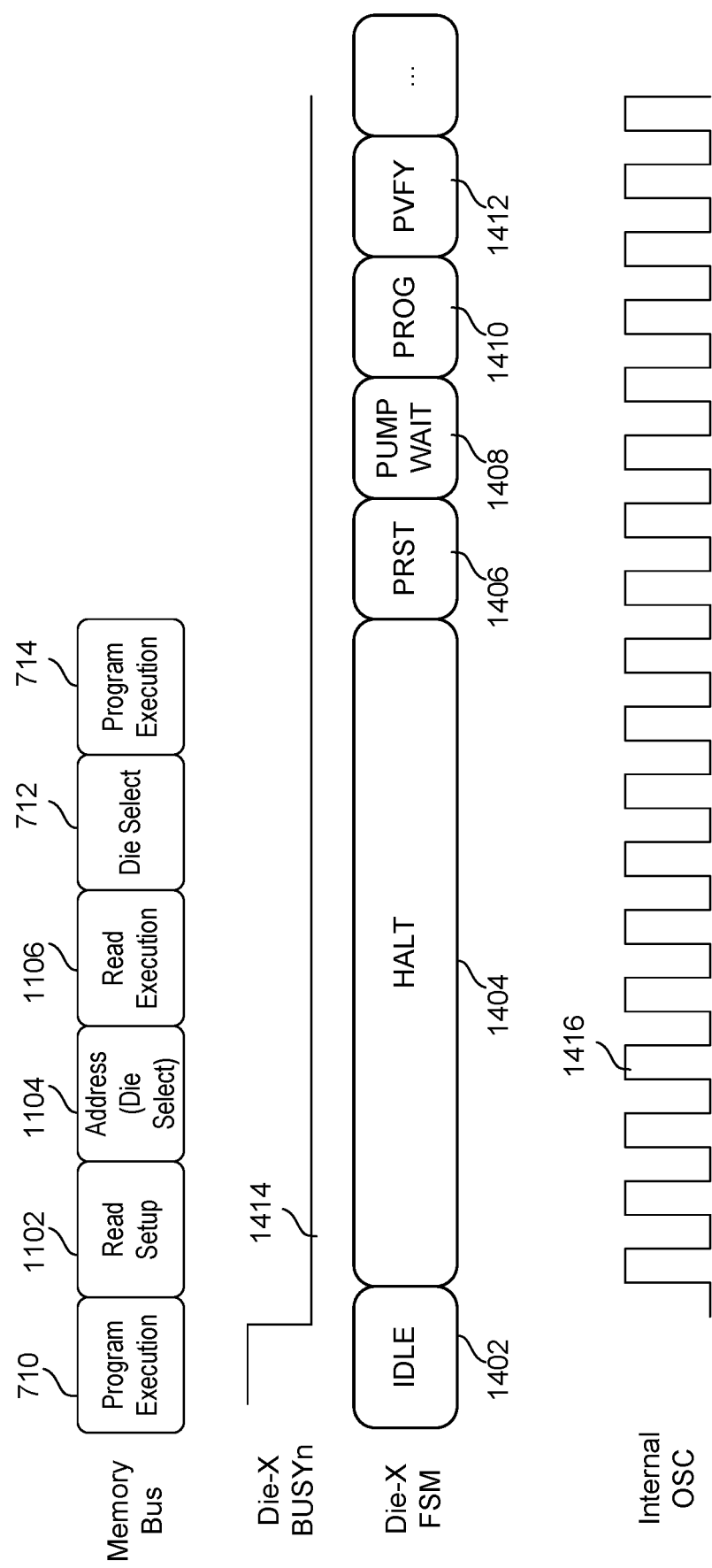
FIG. 14 depicts further details of one embodiment of operation of a die when program execution is decoupled from dataload in which the wait state has an IDLE and a HALT state.

FIG. 14 depicts further details of one embodiment of operation of a die when program execution is decoupled from dataload. FIG. 14 shows the commands/data on the memory bus 318 starting at the first type of program execution command 710. Recall that the first type of program execution command 710 causes the selected die to enter a wait state. Also depicted on the memory bus are the sequence 1102, 1104, 1106 for the read operation for another die when the die selected to perform the program operation is in the wait state. Also depicted on the memory bus is the die re-select 712 and the second type of program execution command 714, which have been discussed above.

FIG. 14 depicts a BUSYn signal 1414 for Die-X. Die-X pulls the BUSYn signal 1414 low in response to the first type of program execution command 710, which indicates that Die-X is busy. Note that this is similar to if Die-X were actually executing the program operation. Also note that Die-X is used as an example of the die selected to perform the programming, consistent with the example in FIG. 7. The internal OSC 1416 refers to when an internal oscillator on Die-X is running.

Also depicted are states for a finite state machine (FSM) for Die-X. In this embodiment, the wait state includes an IDLE state 1402 followed by a HALT state 1404. After the second type of program execution command 714 is a program reset (PRST) 1406, which clears various circuitry on Die-X prior to the programming of the memory cells. The PUMP WAIT 1408 is to wait for analog generators to generate voltages needed for programming. Next are a series of program (PROG) 1410 and program verify (PVFY) 1412 stages. During PROG 1410 a program pulse is applied to the memory cells. During PVFY 1412 the threshold voltages of the memory cells are tested with respect to target threshold voltages. The PROG 1410 and PVFY 1412 stages will repeat until the memory cells have been successfully programmed to their respective target states (such as target threshold voltage). Note that the HALT state 1404 delays the state of the PRST 1406 and PUMP WAIT 1408, which saves current and/or power. That is, the HALT state 1404 uses less current and/or power than PRST 1406 or PUMP WAIT 1408.

Figure 15:
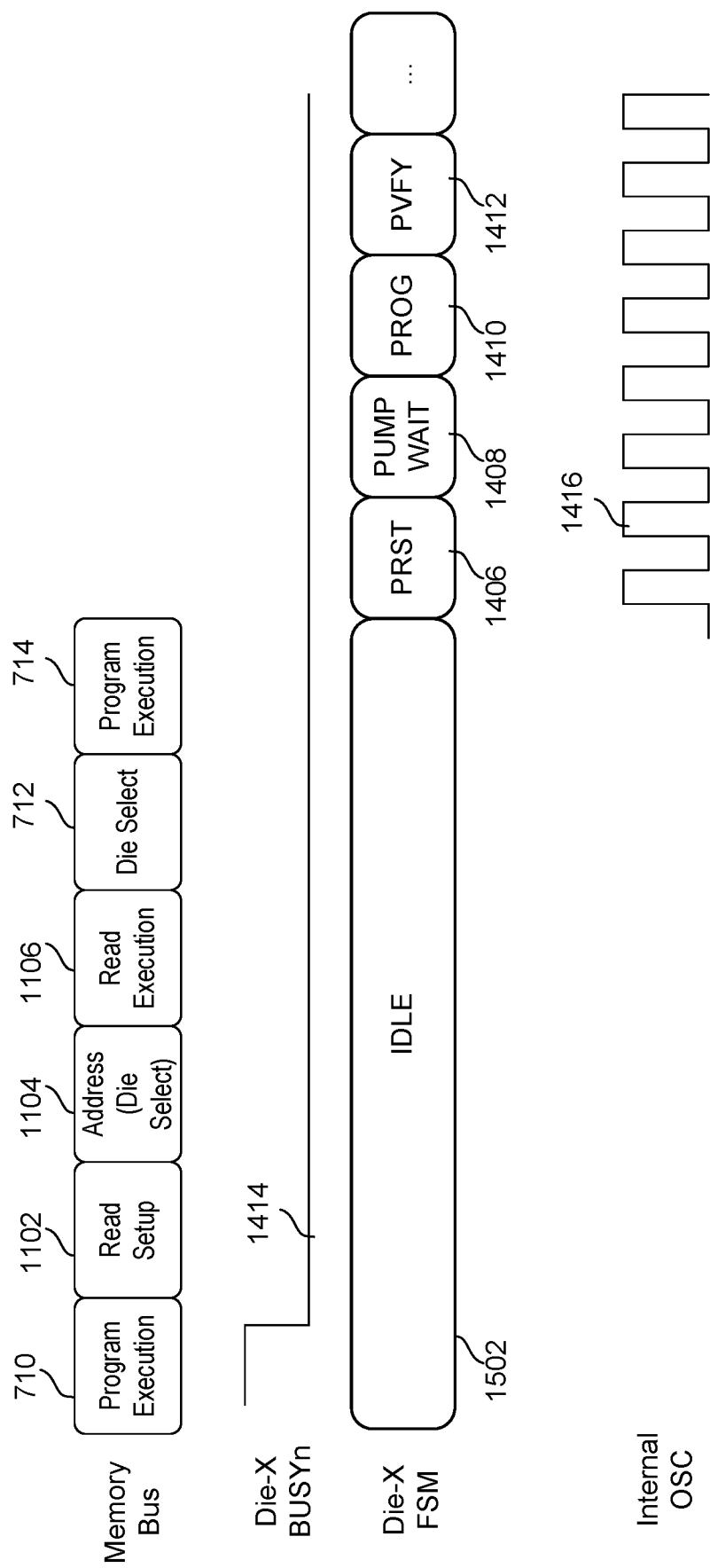
FIG. 15 depicts further details of one embodiment of operation of a die when program execution is decoupled from dataload in which the wait state has an IDLE state but not a HALT state.

Running the internal oscillator 1416 consumes some power and current. Therefore, to save power and/or current the internal oscillator 1416 can be started later than is depicted in FIG. 14. FIG. 15 depicts an alternative embodiment in which the wait state has an IDLE state 1502, but not a HALT state. The internal oscillator 1416 is not run during the IDLE state 1502. The IDLE state 1502 lasts between the first type of program execution command 710 and the second type of program execution command 714. Therefore, power and/or current is saved relative to the embodiment of FIG. 14.

In view of the foregoing, it can be seen that one embodiment includes an apparatus, comprising a plurality of semiconductor dies. Each semiconductor die is configured to connect to a respective memory structure having non-volatile memory cells and to program data into the non-volatile memory cells in the respective memory structure. Each semiconductor die is configured to access commands and data from a common memory bus. A first semiconductor die of the plurality of semiconductor dies comprises one or more control circuits configured to load data from the memory bus into temporary storage on the first semiconductor die, wherein the data is to be programmed by the first semiconductor die for a program operation into non-volatile memory cells. The one or more control circuits are configured to access a first type of program execution command for the program operation from the memory bus after loading the data into the temporary storage. The one or more control circuits are configured to enter a wait state in response to accessing the first type of program execution command to decouple loading the data into the temporary storage from programming the data into the non-volatile memory cells when in a first mode that decouples dataload from program execution. The one or more control circuits are configured to access a second type of program execution command for the program operation from the memory bus while in the wait state. The one or more control circuits are configured to program the data into the non-volatile memory cells in response to accessing the second type of program execution command.

In a second embodiment, in furtherance of the first embodiment, the one or more control circuits of the first semiconductor die are further configured to operate in a second mode in which dataload and program execution are coupled In the second mode the first semiconductor die does not enter the wait state in response to accessing the first type of program execution command after loading data into the temporary storage but instead immediately programs the data into the non-volatile memory cells.

In a third embodiment, in furtherance of the second embodiment, the one or more control circuits of the first semiconductor die are further configured to start an internal oscillator in response to receiving the first type of program execution command while in the second mode. The one or more control circuits of the first semiconductor die are further configured to block the internal oscillator from starting in response to receiving the first type of program execution command while in the first mode.

In a fourth embodiment, in furtherance of the third embodiment, the one or more control circuits of the first semiconductor die are further configured to start the internal oscillator in response to receiving the second type of program execution command while in the first mode.

In a fifth embodiment, in furtherance of any of the first to fourth embodiments, the apparatus further comprises a memory controller connected to the memory bus. The memory controller is configured to place the first semiconductor die into the first mode of operation in which dataload and program execution are decoupled, and place the first semiconductor die into a second mode of operation in which dataload and program execution are coupled.

In a sixth embodiment, in furtherance of any of the first to fifth embodiments, the apparatus further comprises a memory controller connected to the memory bus. The memory controller is configured to select a second semiconductor die of the plurality of semiconductor dies for a memory operation while the first semiconductor die is in the wait state. The memory controller is configured to issue a memory execution command onto the memory bus to cause the second semiconductor die to execute the memory operation while the first semiconductor die remains in the wait state.

In a seventh embodiment, in furtherance of any of the first to sixth embodiments, apparatus further comprises a memory controller connected to the memory bus. The memory controller is configured to allocate a first power token for the first semiconductor die to load the data from the memory bus for the program operation when the first semiconductor die is in the first mode. The memory controller is configured to allocate a second power token for the first semiconductor die to program the data into the non-volatile memory cells in response to accessing the second type of program execution command when the first semiconductor die is in the first mode.

In an eighth embodiment, in furtherance of the seventh embodiment, the memory controller is configured to allocate a single power token for the first semiconductor die to load the data from the memory bus and to program the data into the non-volatile memory cells when the first semiconductor die is in a second mode in which program execution is coupled to dataload.

In a ninth embodiment, in furtherance of the eighth embodiment, the single power token has a larger value than the first power token. The single power token has a larger value than the second power token. The memory controller is configured to schedule memory operations based on sizes of power tokens.

In a tenth embodiment, in furtherance of any of the first to ninth embodiments, the one or more control circuits of the first semiconductor die are further configured to access a prefix command on the memory bus that provides a condition for the program operation, wherein the prefix command is on the memory bus prior to selection of the first semiconductor die for the program operation. The one or more control circuits of the first semiconductor die are further configured to program the data into the non-volatile memory cells in accordance with a of the prefix command in response to accessing the second type of program execution command.

In an eleventh embodiment, in furtherance of the tenth embodiment, each of the plurality of semiconductor dies are configured to access the prefix command from the memory bus and store the prefix command on the respective semiconductor die. Each unselected semiconductor die of the plurality of semiconductor dies is configured to delete the prefix command from the respective semiconductor die in response to accessing the first type of program execution command from the memory bus.

In a twelfth embodiment, in furtherance of the eleventh embodiment, a second semiconductor die of the plurality of semiconductor dies is configured to: access the prefix command from the memory bus and store the prefix command in a latch on the second semiconductor die; reset the latch on the second semiconductor die to delete the prefix command in response to accessing the first type of program execution command for the program operation to be performed by the first semiconductor die; access another memory access command from the memory bus after accessing the first type of program execution command; and perform the other memory access command after the second semiconductor die resets the latch on the second semiconductor die.

One embodiment includes a method of operating non-volatile storage. The method comprises entering a first mode of operation in which dataload is coupled with program execution by a semiconductor die. While semiconductor die is in the first mode: loading first data from a memory bus into temporary storage on the semiconductor die; accessing, by the semiconductor die, a first type of program execution command from the memory bus after loading the first data into the temporary storage; immediately programming, by the semiconductor die, the first data into non-volatile memory cells in response to accessing the first type of program execution command. The method comprises entering a second mode of operation in which dataload is decoupled from program execution by the semiconductor die. While the semiconductor die is in the second mode: loading second data from the memory bus into the temporary storage on the semiconductor die; accessing, by the semiconductor die, the first type of program execution command from the memory bus after loading the second data into the temporary storage; entering a wait state in response to accessing the first type of program execution command to decouple loading the second data from programming the second data; accessing, by the semiconductor die, a second type of program execution command from the memory bus while in the wait state; and immediately programming the second data, by the semiconductor die, into non-volatile memory cells in response to accessing the second type of program execution command.

One embodiment includes a non-volatile storage system, comprising a plurality of semiconductor dies, a memory bus connected to the of plurality of semiconductor dies, and a memory controller connected to the plurality of semiconductor dies by way of the memory bus. Each semiconductor die is configured to program non-volatile memory cells in a memory structure. The memory controller is configured to select a first semiconductor die of the plurality of semiconductor dies for a program operation. The memory controller is configured to place, onto the memory bus, data that is to be programmed into one or more groups of non-volatile memory cells by the first semiconductor die for the program operation. The memory controller is configured to issue a first type of program execution command onto the memory bus to cause the first semiconductor die to enter a wait state instead of programming the data into the one or more groups of non-volatile memory cells when the first semiconductor die is in a first mode of operation. The memory controller is configured to re-select the first semiconductor die for the program operation while the first semiconductor die remains in the wait state. The memory controller is configured to issue a second type of program execution command onto the memory bus to cause the first semiconductor die to immediately program the data into the one or more groups of non-volatile memory cells.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:
1. An apparatus comprising:
a plurality of semiconductor dies, wherein each semiconductor die is configured to connect to a respective memory structure having non-volatile memory cells and to program data into the non-volatile memory cells in the respective memory structure, wherein each semi- conductor die is configured to access commands and
data from a common memory bus;
wherein a first semiconductor die of the plurality of
   semiconductor dies comprises one or more control
   circuits configured to:
   load data from the memory bus into temporary storage
      on the first semiconductor die, wherein the data is to
      be programmed by the first semiconductor die for a
      program operation into non-volatile memory cells;
   access a first type of program execution command for
      the program operation from the memory bus after
      loading the data into the temporary storage;
   operate in a first mode responsive to a first signal from
      a memory controller in which dataload and program
      execution are decoupled, including:
      enter a wait state in response to accessing the first
         type of program execution command to decouple
         loading the data into the temporary storage from
         programming the data into the non-volatile
         memory cells when in the first mode that
         decouples dataload from program execution;
      access a second type of program execution command
         for the program operation from the memory bus
         while in the wait state and in the first mode;
      program the data from the temporary storage into the
         non-volatile memory cells in response to access-
         ing the second type of program execution com-
         mand while in the first mode;
   operate in a second mode responsive to a second signal
      from the memory controller in which dataload and
      program execution are coupled, wherein in the second
      mode the first semiconductor die does not enter the wait
      state in response to accessing the first type of program
      execution command after loading data into the tempo-
      rary storage but instead immediately programs the data
      from the temporary storage into the non-volatile
      memory cells.

2. The apparatus of claim 1, wherein the one or more control circuits of the first semiconductor die are further configured to:
   start an internal oscillator in response to receiving the first type of program execution command while in the second mode; and
   block the internal oscillator from starting in response to receiving the first type of program execution command while in the first mode.

3. The apparatus of claim 2, wherein the one or more control circuits of the first semiconductor die are further configured to:
   start the internal oscillator in response to receiving the second type of program execution command while in the first mode.

4. The apparatus of claim 1, further comprising a memory controller connected to the memory bus, wherein the memory controller is configured to:
   select a second semiconductor die of the plurality of semiconductor dies for a memory operation while the first semiconductor die is in the wait state; and
   issue a memory execution command onto the memory bus to cause the second semiconductor die to execute the memory operation while the first semiconductor die remains in the wait state.

5. The apparatus of claim 1, further comprising a memory controller connected to the memory bus, wherein the memory controller is configured to:
   allocate a first power token for the first semiconductor die to load the data from the memory bus for the program operation when the first semiconductor die is in the first mode; and
   allocate a second power token for the first semiconductor die to program the data into the non-volatile memory cells in response to accessing the second type of program execution command when the first semiconductor die is in the first mode.

6. The apparatus of claim 5, wherein the memory controller is configured to:
   allocate a single power token for the first semiconductor die to load the data from the memory bus and to program the data into the non-volatile memory cells when the first semiconductor die is in a second mode in which program execution is coupled to dataload.

7. The apparatus of claim 6, wherein:
   the single power token has a larger value than the first power token;
   the single power token has a larger value than the second power token; and
   the memory controller is configured to schedule memory operations based on sizes of power tokens.

8. The apparatus of claim 1, wherein the one or more control circuits of the first semiconductor die are further configured to:
   access a prefix command on the memory bus that provides a condition for the program operation, wherein the prefix command is on the memory bus prior to selection of the first semiconductor die for the program operation; and
   program the data into the non-volatile memory cells in accordance with a condition of the prefix command in response to accessing the second type of program execution command.

9. The apparatus of claim 8, wherein:
   each of the plurality of semiconductor dies are configured to access the prefix command from the memory bus and store the prefix command on the respective semiconductor die; and
   each unselected semiconductor die of the plurality of semiconductor dies is configured to delete the prefix command from the respective semiconductor die in response to accessing the first type of program execution command from the memory bus.

10. The apparatus of claim 8, wherein a second semiconductor die of the plurality of semiconductor dies is configured to:
   access the prefix command from the memory bus and store the prefix command in a latch on the second semiconductor die;
   reset the latch on the second semiconductor die to delete the prefix command in response to accessing the first type of program execution command for the program operation to be performed by the first semiconductor die;
   access another memory access command from the memory bus after accessing the first type of program execution command; and
   perform the other memory access command after the second semiconductor die resets the latch on the second semiconductor die.

11. A method of operating non-volatile storage, the method comprising:
   entering a first mode of operation in which dataload is coupled with program execution by a semiconductor die in response to a first signal from a memory controller, while the semiconductor die is in the first mode:
  loading first data from a memory bus into temporary storage on the semiconductor die;
  accessing, by the semiconductor die, a first type of program execution command from the memory bus after loading the first data into the temporary storage;
  immediately programming, by the semiconductor die, the first data from the temporary storage into non-volatile memory cells in response to accessing the first type of program execution command; and
entering a second mode of operation in which dataload is decoupled from program execution by the semiconductor die in response to a second signal from the memory controller, while the semiconductor die is in the second mode:
  loading second data from the memory bus into the temporary storage on the semiconductor die;
  accessing, by the semiconductor die, the first type of program execution command from the memory bus after loading the second data into the temporary storage;
  entering a wait state in response to accessing the first type of program execution command to decouple loading the second data from programming the second data;
  accessing, by the semiconductor die, a second type of program execution command from the memory bus while in the wait state; and
  immediately programming the second data, by the semiconductor die, from the temporary storage into non-volatile memory cells in response to accessing the second type of program execution command.

12. The method of claim 11, wherein the semiconductor die is a first semiconductor die of a plurality of semiconductor dies that are connected to a memory controller by a memory bus, and further comprising:
  selecting, by the memory controller, a second semiconductor die of the plurality of semiconductor dies for a memory operation while the first semiconductor die is in the wait state; and
  issuing, by the memory controller, a memory execution command onto the memory bus to cause the second semiconductor die to execute the memory operation while the first semiconductor die remains in the wait state.

13. The method of claim 11, further comprising:
  issuing a first power token for the loading the second data from the memory bus into the semiconductor die while the semiconductor die is in the second mode; and
  issuing a second power token for programming, by the semiconductor die, the second data into the non-volatile memory cells while the semiconductor die is in the second mode.

14. The method of claim 11, wherein the semiconductor die is a first semiconductor die of a plurality of semiconductor dies that are connected to a memory controller by a memory bus, and further comprising:
  accessing, by each of the plurality of semiconductor dies, a prefix command on the memory bus that provides a condition for programming the data, wherein the accessing occurs prior to selection of the first semiconductor die;
  storing, by the first semiconductor die and a subset that includes every semiconductor die of the plurality of semiconductor dies but the first semiconductor die, the prefix command into storage on each respective semiconductor die;
  deleting the prefix command from storage on each respective semiconductor die of the subset in response to each respective semiconductor die of the subset accessing the first type of program execution command from the memory bus; and
  programming, by the first semiconductor die, the second data into the non-volatile memory cells in accordance with the prefix command in response to the first semiconductor die accessing the second type of program execution command.

15. A non-volatile storage system, the system comprising:
  a plurality of semiconductor dies, each semiconductor die configured to program non-volatile memory cells in a memory structure;
  a memory bus connected to the plurality of semiconductor dies; and
  a memory controller connected to the plurality of semiconductor dies by way of the memory bus, wherein the memory controller is configured to:
    place a first semiconductor die into a first mode of operation in which dataload and program execution are decoupled;
    select the first semiconductor die of the plurality of semiconductor dies for a program operation while the first semiconductor die is in the first mode;
    place, onto the memory bus, data that is to be programmed into one or more groups of non-volatile memory cells by the first semiconductor die for the program operation;
    issue a first type of program execution command onto the memory bus to cause the first semiconductor die to hold the data in temporary storage and enter a wait state instead of programming the data into the one or more groups of non-volatile memory cells while the first semiconductor die is in the first mode of operation;
    re-select the first semiconductor die for the program operation while the first semiconductor die remains in the wait state and is the first mode; and
    issue a second type of program execution command onto the memory bus to cause the first semiconductor die to immediately program the data from the temporary storage into the one or more groups of non-volatile memory cells in the first mode;
    place the first semiconductor die into a second mode of operation in which dataload and program execution are coupled;
    select the first semiconductor for a program operation while the first semiconductor die is in the second mode;
    place, onto the memory bus, data that is to be programmed into one or more groups of non-volatile memory cells by the first semiconductor die for the program operation; and
    issue the first type of program execution command onto the memory bus to cause the first semiconductor die to immediately program the data from the temporary storage into the one or more groups of non-volatile memory cells while in the second mode.

16. The non-volatile storage system of claim 15, wherein the memory controller is further configured to:
- when the first semiconductor die is in the first mode:
  - allocate a first power token for the first semiconductor die to load the data from the memory bus into temporary storage on the first semiconductor die; and
  - allocate a second power token for the first semiconductor die to program the data from the temporary storage into non-volatile memory cells; and
- when the first semiconductor die is in the second mode:
  - allocate a single power token for the first semiconductor die to load the data from the memory bus and to program the data into the one or more groups of non-volatile memory cells, wherein the single power token has a larger value than the first power token, wherein the single power token has a larger value than the second power token.

17. The non-volatile storage system of claim 15, wherein the memory controller is further configured to:
- select a second semiconductor die of the plurality of semiconductor dies for a memory operation while the first semiconductor die is in the wait state; and
- issue a memory execution command onto the memory bus to cause the second semiconductor die to execute the memory operation while the first semiconductor die remains in the wait state.

* * * * *